(12) United States Patent
Chu et al.

(10) Patent No.: US 10,941,498 B2
(45) Date of Patent: Mar. 9, 2021

(54) PANEL TO BE PLATED, ELECTROPLATING PROCESS USING THE SAME, AND CHIP MANUFACTURED FROM THE SAME

(71) Applicant: INDUSTRIAL TECHNOLOGY RESEARCH INSTITUTE, Hsinchu (TW)

(72) Inventors: Chien-Hsun Chu, Kaohsiung (TW); Chien-Chou Tseng, Hsinchu (TW); Ming-Huan Yang, Hsinchu (TW); Tai-Jui Wang, Kaohsiung (TW); Yu-Hua Chung, Zhutian Township (TW); Chieh-Wei Feng, Taoyuan (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 1 day.

(21) Appl. No.: 16/447,358

(22) Filed: Jun. 20, 2019

(65) Prior Publication Data

US 2020/0063282 A1 Feb. 27, 2020

Related U.S. Application Data

(60) Provisional application No. 62/720,252, filed on Aug. 21, 2018.

(30) Foreign Application Priority Data

Dec. 24, 2018 (TW) .................................. 10714684.6

(51) Int. Cl.
*H01L 29/40* (2006.01)
*C25D 5/02* (2006.01)
(Continued)

(52) U.S. Cl.
CPC ................. *C25D 5/02* (2013.01); *C25D 7/12* (2013.01); *H01L 21/2885* (2013.01); *H01L 23/528* (2013.01)

(58) Field of Classification Search
CPC . C25D 5/02; C25D 7/12; C25D 7/123; C25D 5/022; H01L 23/528;
(Continued)

(56) References Cited

U.S. PATENT DOCUMENTS 542,973 A 7/1895 Carver
5,429,738 A 7/1995 Beyerle et al.
(Continued)

FOREIGN PATENT DOCUMENTS

CN 1272685 A 11/2000
CN 1551931 A 12/2004
(Continued)

OTHER PUBLICATIONS

Taiwanese Office Action and Search Report dated Oct. 5, 2019, for Taiwanese Application No. 107146846.
(Continued)

*Primary Examiner* — Robert G Bachner
(74) *Attorney, Agent, or Firm* — Birch, Stewart, Kolasch & Birch, LLP

(57) ABSTRACT

A panel to be plated is provided. The panel includes a substrate and an electric field compensation structure. The substrate includes a plurality of units to be plated each including a first pattern to be plated. The electric field compensation structure is disposed on the substrate. The electric field compensation structure includes a second pattern to be plated surrounding at least one of the units to be plated. A ratio of an area of the first pattern to be plated of the units to be plated to an area of the second pattern to be plated of the electric field compensation structure is in a range from 1:0.07 to 1:0.3.

20 Claims, 17 Drawing Sheets

(51) Int. Cl.
*C25D 7/12* (2006.01)
*H01L 23/528* (2006.01)
*H01L 21/288* (2006.01)

(58) Field of Classification Search
CPC ........... H01L 21/2885; H01L 21/76885; H01L 23/522; H01L 23/488
See application file for complete search history.

(56) References Cited

U.S. PATENT DOCUMENTS

| | | | |
|---|---|---|---|
| 6,297,155 | B1 | 10/2001 | Simpson et al. |
| 6,517,689 | B1 | 2/2003 | Hongo et al. |
| 7,803,257 | B2 | 9/2010 | Chang et al. |
| 8,277,602 | B2 | 10/2012 | Dünnebeil et al. |
| 8,585,875 | B2 | 11/2013 | Cummings et al. |
| 9,833,802 | B2 | 12/2017 | Kalistaja et al. |
| 2017/0335484 | A1 | 11/2017 | Wilson et al. |

FOREIGN PATENT DOCUMENTS

| | | |
|---|---|---|
| CN | 1714177 A | 12/2005 |
| CN | 102605397 A | 7/2012 |
| CN | 104388994 A | 3/2015 |
| CN | 105415882 A | 3/2016 |
| CN | 105821457 A | 8/2016 |
| CN | 107208299 A | 9/2017 |
| TW | I306127 B | 2/2009 |
| TW | 201544634 A | 12/2015 |
| TW | 201809370 A | 3/2018 |

OTHER PUBLICATIONS

Chinese Office Action and Search Report for Chinese Application No. 201910184315.9, dated Jul. 1, 2020.

PANEL TO BE PLATED, ELECTROPLATING PROCESS USING THE SAME, AND CHIP MANUFACTURED FROM THE SAME

This application is a non-provisional application of provisional application Ser. No. 62/720,252 filed Aug. 21, 2018 and claims the benefit of Taiwan application Serial No. 107146846, filed Dec. 24, 2018, the disclosure of which is incorporated by reference herein in its entirety.

TECHNICAL FIELD

The disclosure relates in general to a panel to be plated, an electroplating process using the same, and a chip manufactured from the same.

BACKGROUND

Semiconductor products have become indispensable to modern people in the daily life. Due to many reasons, such as cost reduction, the current trend is to manufacture semiconductor devices on a larger substrate. For example, larger wafer is used for manufacturing the chip. Nowadays, it is even suggested that the panel can replace conventional wafer and be used as the substrate for manufacturing the chip.

Electroplating process is commonly used in the semiconductor industry. However, as the size of the substrate becomes larger, the electric field applied to the substrate by the electroplating device may vary at different parts of the substrate. Thus, the electroplating layer may become non-uniform and the electroplated substrate may even become warped. Currently, the most commonly used method to resolve the above problem is to improve the electroplating device.

SUMMARY

According to one embodiment, a panel to be plated is provided. The panel includes a substrate and an electric field compensation structure. The substrate includes a plurality of units to be plated each including a first pattern to be plated. The electric field compensation structure is disposed on the substrate. The electric field compensation structure includes a second pattern to be plated surrounding at least one of the units to be plated. A ratio of an area of the first pattern to be plated of the units to be plated to an area of the second pattern to be plated of the electric field compensation structure is in a range from 1:0.07 to 1:0.3.

According to another embodiment, an electroplating process is provided. The electroplating process includes the following steps. Firstly, an electroplating device having a cathode and an anode is provided. Then, a panel to be plated is fixed to the cathode of the electroplating device. Then, an electroplating material is fixed at the anode of the electroplating device. Then, an electroplating layer made of the electroplating material is formed on the first pattern to be plated of the units to be plated and the second pattern to be plated of the electric field compensation structure of the panel to be plated by the electroplating device.

According to an alternative embodiment, a chip is provided. The chip includes a circuit region and a dummy circuit. The circuit region includes a circuit. The circuit includes a first electroplating layer. The dummy circuit surrounds the circuit region. The dummy circuit includes a second electroplating layer. The first electroplating layer and the second electroplating layer are formed of the same material. A ratio of an area of the circuit to an area of the dummy circuit is in a range from 1:0.07 to 1:0.3.

The above and other aspects of the invention will become better understood with regard to the following detailed description of the preferred but non-limiting embodiment(s). The following description is made with reference to the accompanying drawings.

Figure 1:
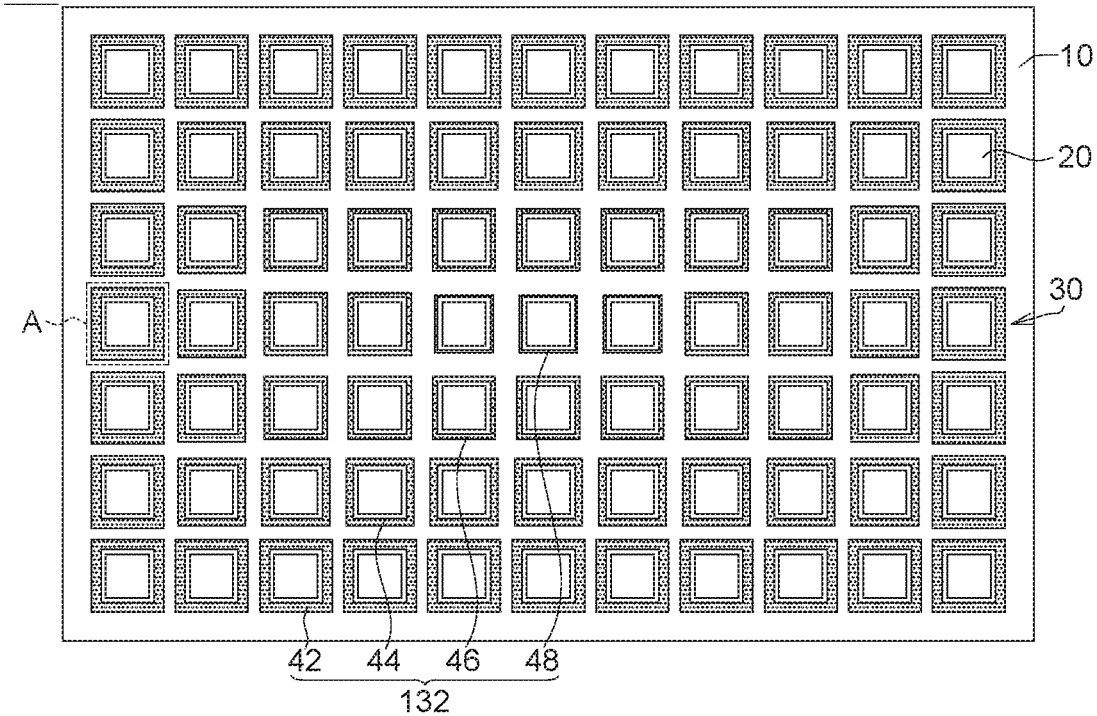
FIG. 1 is a top view of a panel to be plated.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

DETAILED DESCRIPTION

Detailed descriptions of the embodiments of the invention are made with reference to accompanying drawings. It should be understood that the accompanying drawings and related descriptions are for explaining and describing the present invention, not for limiting the scope of the present invention. For example, the elements may not be illustrated according actual shapes or scales. Although the elements, conditions and features disclosed in an embodiment can also be adopted in another embodiment, no further exemplifications are provided.

An embodiment of the present invention relates to a panel to be plated. Referring to FIG. 1, a panel 100 to be plated is shown. The panel 100 includes a substrate 10 and an electric field compensation structure 30. The substrate 10 includes a plurality of units 20 to be plated each including first patterns 22 to be plated (referring to FIGS. 2A to 2B). The electric field compensation structure 30 is disposed on the substrate 10, and includes second patterns 132 to be plated surrounding at least one of the units 20 to be plated. A ratio of an area of the first patterns 22 to be plated of the units 20 to be plated to an area of the second patterns 132 to be plated of the electric field compensation structure 30 is in a range from 1:0.07 to 1:0.3.

Figure 2A:
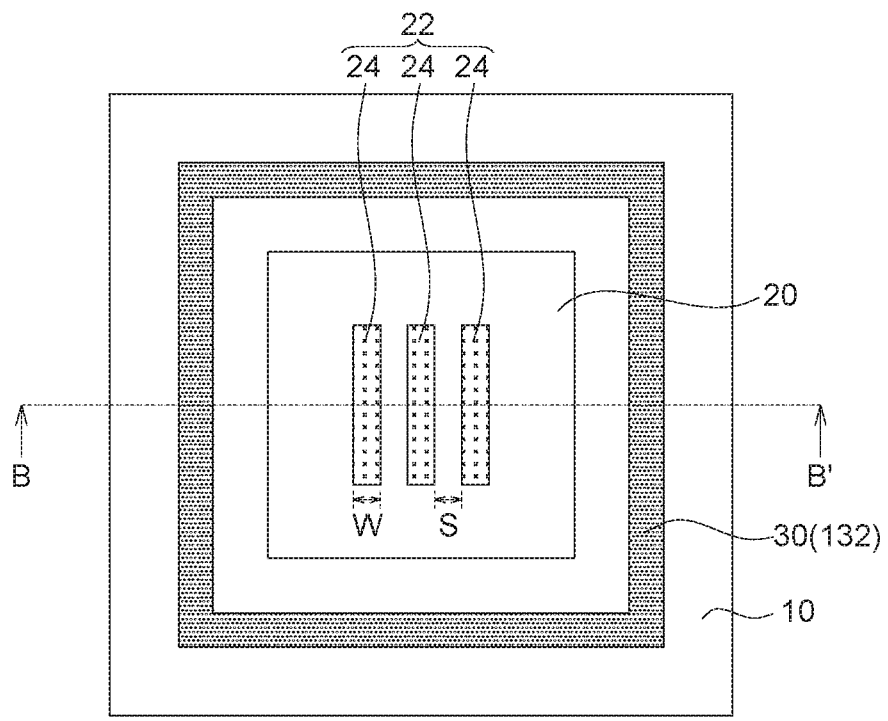
FIG. 2A and FIG. 2B respectively are a top view and a cross-sectional view of a region A of the panel of FIG. 1.
Figure 2B:
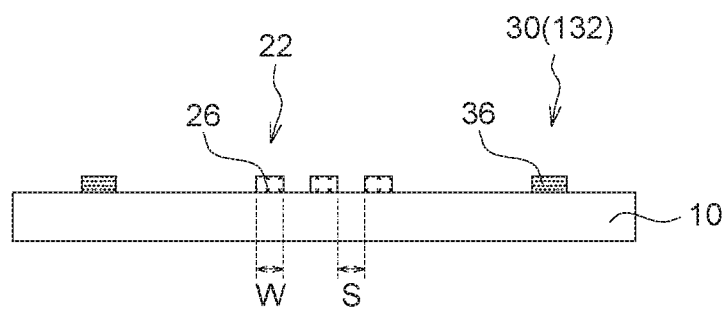

Each unit 20 to be plated can be realized by such as a chip unit or a redistribution layer (RDL). In an illustrative rather than a restrictive sense, the chip unit can be used in a fan-out package structure. FIGS. 2A to 2B are enlarged diagrams of a region A of the panel 100. FIG. 2A is a top view of the region A of the panel 100. FIG. 2B is a cross-sectional view along a cross-sectional line B-B' of the region A of the panel 100 of FIG. 2A. According to some embodiments as indicated in FIGS. 2A to 2B, the first patterns 22 to be plated may include a plurality of wire patterns 24 used for forming wires. The wire patterns may have a wire width W and a spacing S. In some embodiments, the wire width W is less than or equivalent to 15 microns (μm), and the spacing S is less than or equivalent to 15 μm. It can be understood that the configuration (such as the shape, arrangement, connection and dimension) of the first patterns 22 to be plated is not limited to the above exemplifications. In some embodiments, a total area of the first patterns 22 to be plated of the units 20 to be plated is in a range of 15% to 65% of an area of the substrate 10. In some embodiments, the first patterns 22 to be plated may include a first seed layer 26. In some embodiments, the first seed layer 26 includes at least one element selected from a group consisting of copper, gold, aluminum, nickel, chrome, and titanium.

Refer to FIG. 1 again. The second patterns 132 to be plated of the panel 100 includes a plurality of unit frame patterns (such as first unit frame patterns 42, second unit frame patterns 44, third unit frame patterns 46, fourth unit frame patterns 48) respectively surrounding one of the units 20 to be plated. The quantity of the unit frame patterns of the second patterns 132 to be plated is the same as that of the units 20 to be plated. Each unit 20 to be plated has a corresponding unit frame pattern. In the electroplating process, the electric field may gradually intensify from the center towards the edge of the substrate 10, and the arrangement of distributing the second patterns 132 to be plated over the entire substrate 10 is beneficial to the uniformity of the electric field. Besides, the wire widths of the unit frame patterns may diminish in a direction from the edge towards the center of the substrate 10. In the electroplating process, the arrangement of diminishing wire widths is beneficial for the compensation of the relatively strong electric field at the edges, and therefore stabilizing the electric current outputted to the units 20 to be plated. In one embodiment, from the edge to the center of the substrate 10, the unit frame patterns may include a plurality of first unit frame patterns 42, a plurality of second unit frame patterns 44, a plurality of third unit frame patterns 46, and a plurality of fourth unit frame patterns 48, respectively surrounding corresponding units 20 to be plated completely (or partly). The wire widths of the first unit frame patterns 42, the second unit frame patterns 44, the third unit frame patterns 46, and the fourth unit frame patterns 48 diminish in order. Since the unit frame patterns of the second patterns 132 to be plated correspond to the units 20 to be plated, a ratio of an area of the first patterns 22 to be plated of a unit 20 to be plated to an area of corresponding unit frame patterns is also in a range from 1:0.07 to 1:0.3. In some embodiments, the second patterns to be plated, such as the unit frame patterns, can further have a portion extended towards the units 20 to be plated.

Refer to FIGS. 2A to 2B. According to some embodiments, the second patterns 132 to be plated may include a second seed layer 36. In some embodiments, the second seed layer 36 includes at least one element selected from a group consisting of copper, gold, aluminum, nickel, chrome, and titanium. The selection of the materials of the first seed layer 26 and the second seed layer 36 depends on what electroplating material is used in the subsequent electroplating process. The first seed layer 26 and the second seed layer 36 can be formed of the same material or can be formed of different materials but each material includes the electroplating material. For example, given that the electroplating material is copper, the first seed layer 26 and the second seed layer 36 can be formed of titanium copper alloy (TiCu).

Figure 3:
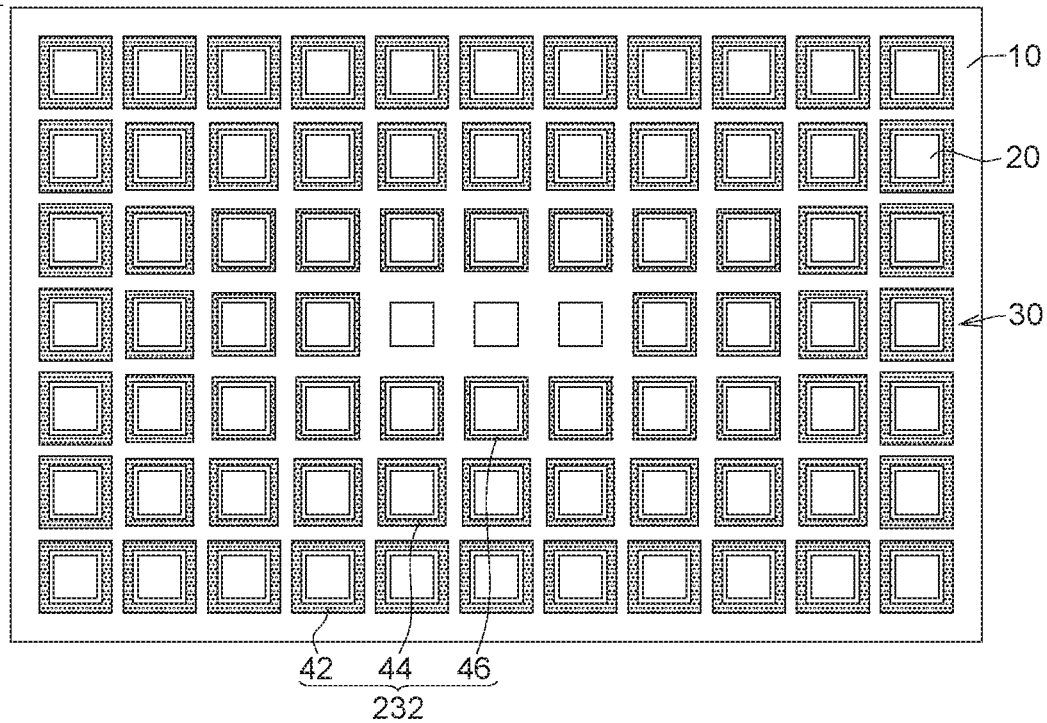
FIG. 3 is a top view of another panel to be plated.

Referring to FIG. 3, another panel 200 to be plated is shown. The panel 200 is different from the panel 100 mainly in the arrangement of the second patterns to be plated, and the similarities are not repeated here.

The second patterns 232 to be plated of the panel 200 also includes a plurality of unit frame patterns (such as first unit frame patterns 42, second unit frame patterns 44, third unit frame patterns 46, and fourth unit frame patterns 48) arranged on the periphery of most units 20 to be plated but the units 20 to be plated at the central region of the substrate 10. In the electroplating process, the above arrangement is still beneficial for the compensation of the relatively strong electric field at the edges. In one embodiment, from the edge to the center of the substrate 10, the unit frame patterns may include a plurality of first unit frame patterns 42, a plurality of second unit frame patterns 44, and a plurality of third unit frame patterns 46, respectively surrounding corresponding units 20 to be plated. The wire widths of the first unit frame patterns 42, the second unit frame patterns 44, and the third unit frame patterns 46 may diminish in order.

Figure 4:
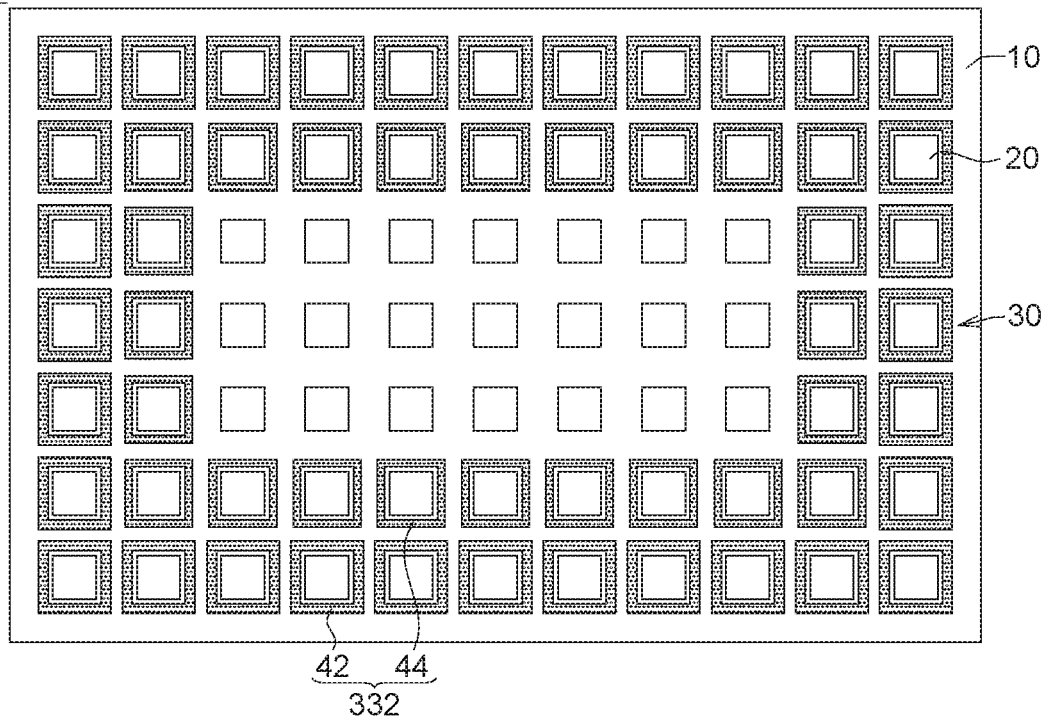
FIG. 4 is a top view of another panel to be plated.

Referring to FIG. 4, another panel 300 to be plated is shown. The panel 300 is different from the panel 100 mainly in the arrangement of the second patterns to be plated, and the similarities are not repeated here.

The second patterns 332 to be plated of the panel 300 also include a plurality of unit frame patterns (such as first unit frame patterns 42 and second unit frame patterns 44) arranged on the periphery of the units 20 to be plated closer to the edge of the substrate 10. In the electroplating process, the above arrangement is still beneficial for the compensation of the relatively strong electric field at the edges. In one embodiment, from the edge to the center of the substrate 10, the unit frame patterns may include a plurality of first unit frame patterns 42 and a plurality of second unit frame patterns 44, respectively surrounding corresponding units 20 to be plated. The wire widths of the first unit frame patterns 42 and the second unit frame patterns 44 may diminish in order.

Figure 5:
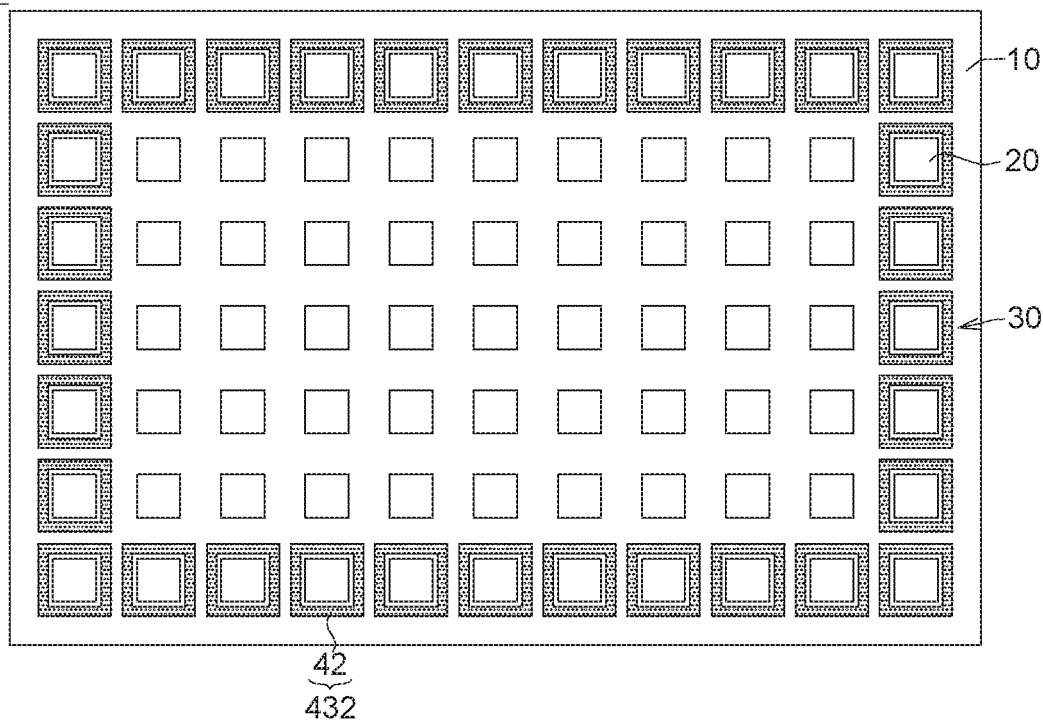
FIG. 5 is a top view of another panel to be plated.

Referring to FIG. 5, another panel 400 to be plated is shown. The panel 400 is different from the panel 100 mainly in the arrangement of the second patterns to be plated, and the similarities are not repeated here.

The second patterns 432 to be plated of the panel 400 also includes a plurality of unit frame patterns (such as first unit frame patterns 42) arranged only on the periphery of the units 20 to be plated closest to the edge of the substrate 10. In the electroplating process, the above arrangement is still beneficial for the compensation of the relatively strong electric field at the edges. In one embodiment, the unit frame patterns may include a plurality of first unit frame patterns 42 surrounding the units 20 to be plated closest to the edge of the substrate 10.

Figure 6:
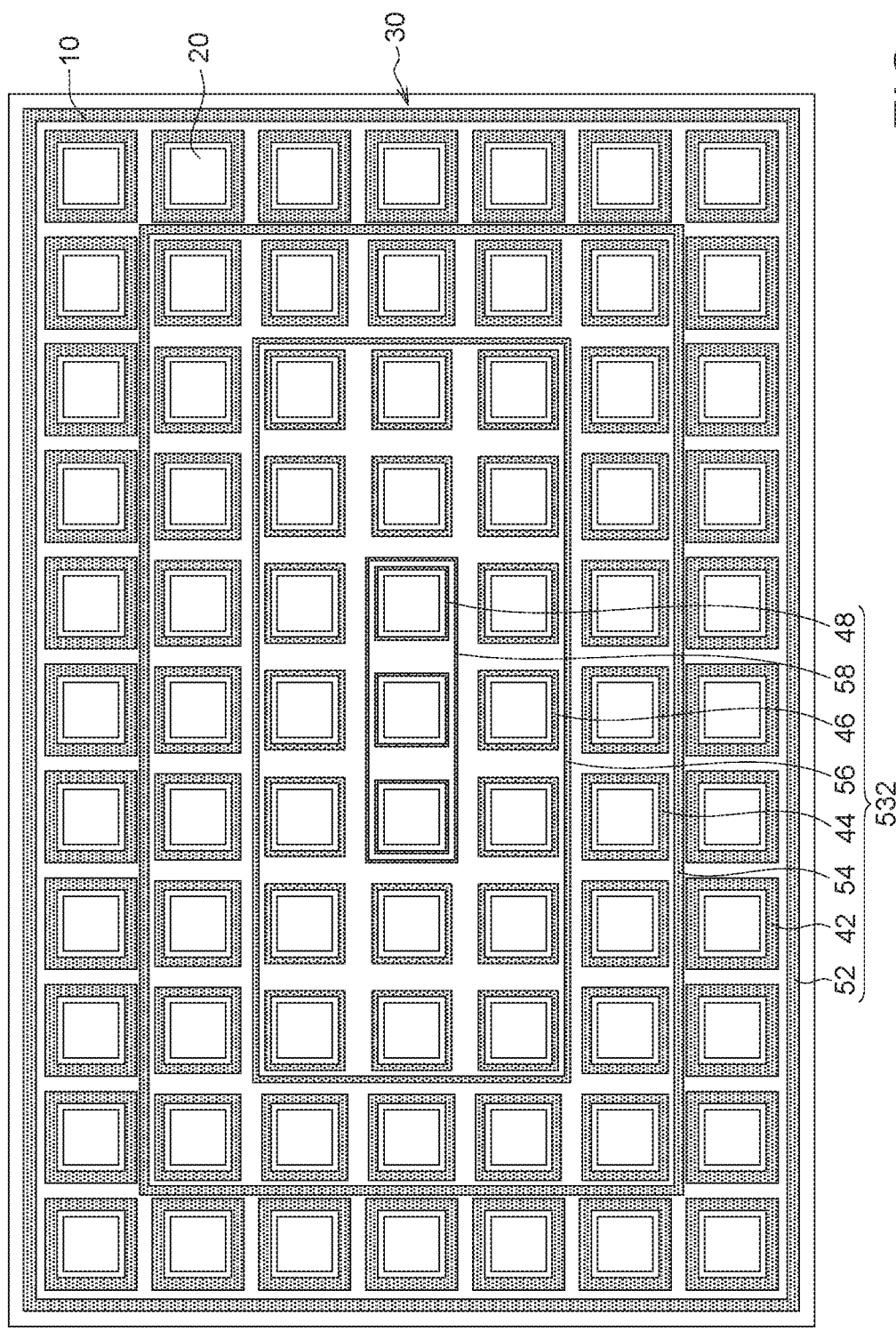
FIG. 6 is a top view of another panel to be plated.

Referring to FIG. 6, another panel 500 to be plated is shown. The panel 500 is different from the panel 100 of FIG. 1 mainly in the arrangement of the second patterns to be plated, and the similarities are not repeated here.

The second patterns 532 to be plated of the panel 500 also include a plurality of unit frame patterns (such as first unit frame patterns 42, second unit frame patterns 44, third unit frame patterns 46, and fourth unit frame patterns 48). The quantity of the unit frame patterns of the second patterns 532 to be plated are the same as that of the units 20 to be plated. Each unit 20 to be plated has a corresponding unit frame pattern. The wire widths of the unit frame patterns may diminish in a direction from the edge towards the center of the substrate 10. In one embodiment, like the panel 100, the unit frame patterns of the panel 500 also may include a plurality of first unit frame patterns 42, a plurality of second unit frame patterns 44, a plurality of third unit frame patterns 46, and a plurality of fourth unit frame patterns 48. The wire widths of the first unit frame patterns 42, the second unit frame patterns 44, the third unit frame patterns 46, and the fourth unit frame patterns 48 diminish in order. The second patterns 532 to be plated further include a plurality of peripheral frame patterns respectively surrounding many of the units 20 to be plated and many of the unit frame patterns. The second patterns 532 to be plated are distributed over the entire substrate 10, and such arrangement is beneficial to the uniformity of the electric field in the electroplating process. Besides, the wire widths of the peripheral frame patterns may diminish in a direction from the edge towards the center of the substrate 10. In the electroplating process, the arrangement of diminishing wire widths is beneficial for the compensation of the relatively strong electric field at the edges. In one embodiment, the peripheral frame patterns may include a first peripheral frame pattern 52, a second peripheral frame pattern 54, a third peripheral frame pattern 56, and a fourth peripheral frame pattern 58, arranged from the edge towards the center of the substrate 10. The first peripheral frame pattern 52, the second peripheral frame pattern 54, the third peripheral frame pattern 56, and the fourth peripheral frame pattern 58 are correspondingly arranged outside the first unit frame patterns 42, the second unit frame patterns 44, the third unit frame patterns 46, and the fourth unit frame patterns 48. The wire widths of the first peripheral frame pattern 52, the second peripheral frame pattern 54, the third peripheral frame pattern 56, and the fourth peripheral frame pattern 58 diminish in order.

Figure 7:
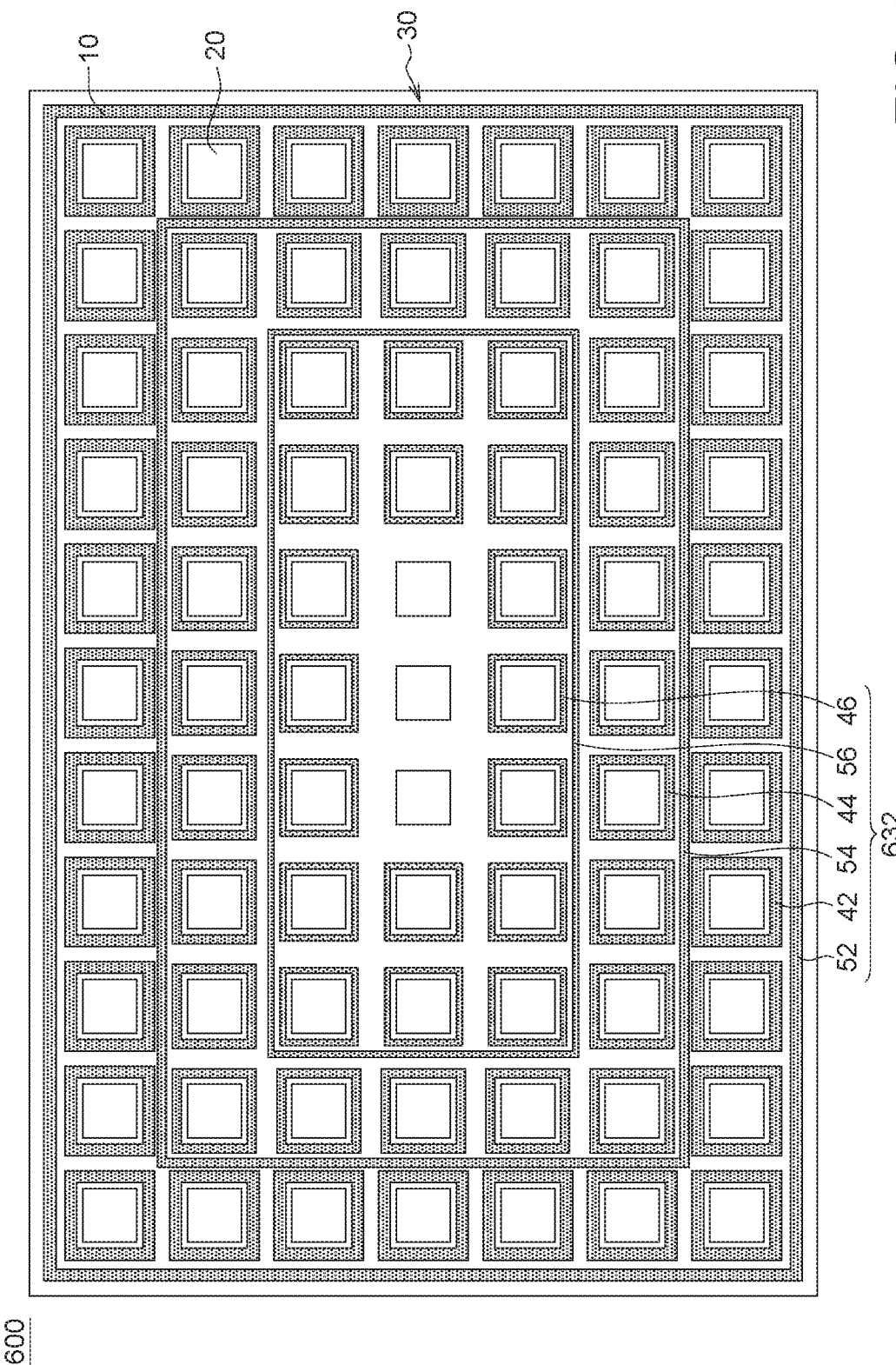
FIG. 7 is a top view of another panel to be plated.

Referring to FIG. 7, another panel 600 to be plated is shown. The panel 600 is different from the panel 500 mainly in the arrangement of the second patterns to be plated, and the similarities are not repeated here.

The second patterns 632 to be plated of the panel 600 also include a plurality of unit frame patterns (such as first unit frame patterns 42, second unit frame patterns 44, and third unit frame patterns 46) and a plurality of peripheral frame patterns (such as first peripheral frame patterns 52, second peripheral frame patterns 54, and third peripheral frame patterns 56). The unit frame patterns and the peripheral frame patterns of the second patterns 632 to be plated are arranged on the periphery of most units 20 to be plated but the units 20 to be plated at the central region of the substrate 10. In the electroplating process, the above arrangement is still beneficial for the compensation of the relatively strong electric field at the edges. In one embodiment, from the edge to the center of the substrate 10, the unit frame patterns may include a plurality of first unit frame patterns 42, a plurality of second unit frame patterns 44, and a plurality of third unit frame patterns 46, respectively surrounding corresponding units 20 to be plated. The wire widths of the first unit frame patterns 42, the second unit frame patterns 44, and the third unit frame patterns 46 diminish in order. Besides, from the edge to the center of the substrate 10, the peripheral frame patterns may include a first peripheral frame pattern 52, a second peripheral frame pattern 54, and a third peripheral frame pattern 56. The first peripheral frame pattern 52, the second peripheral frame pattern 54, and the third peripheral frame pattern 56 are correspondingly arranged outside the first unit frame patterns 42, the second unit frame patterns 44, and the third unit frame patterns 46. The wire widths of the first peripheral frame pattern 52, the second peripheral frame pattern 54, and the third peripheral frame pattern 56 diminish in order.

Figure 8:
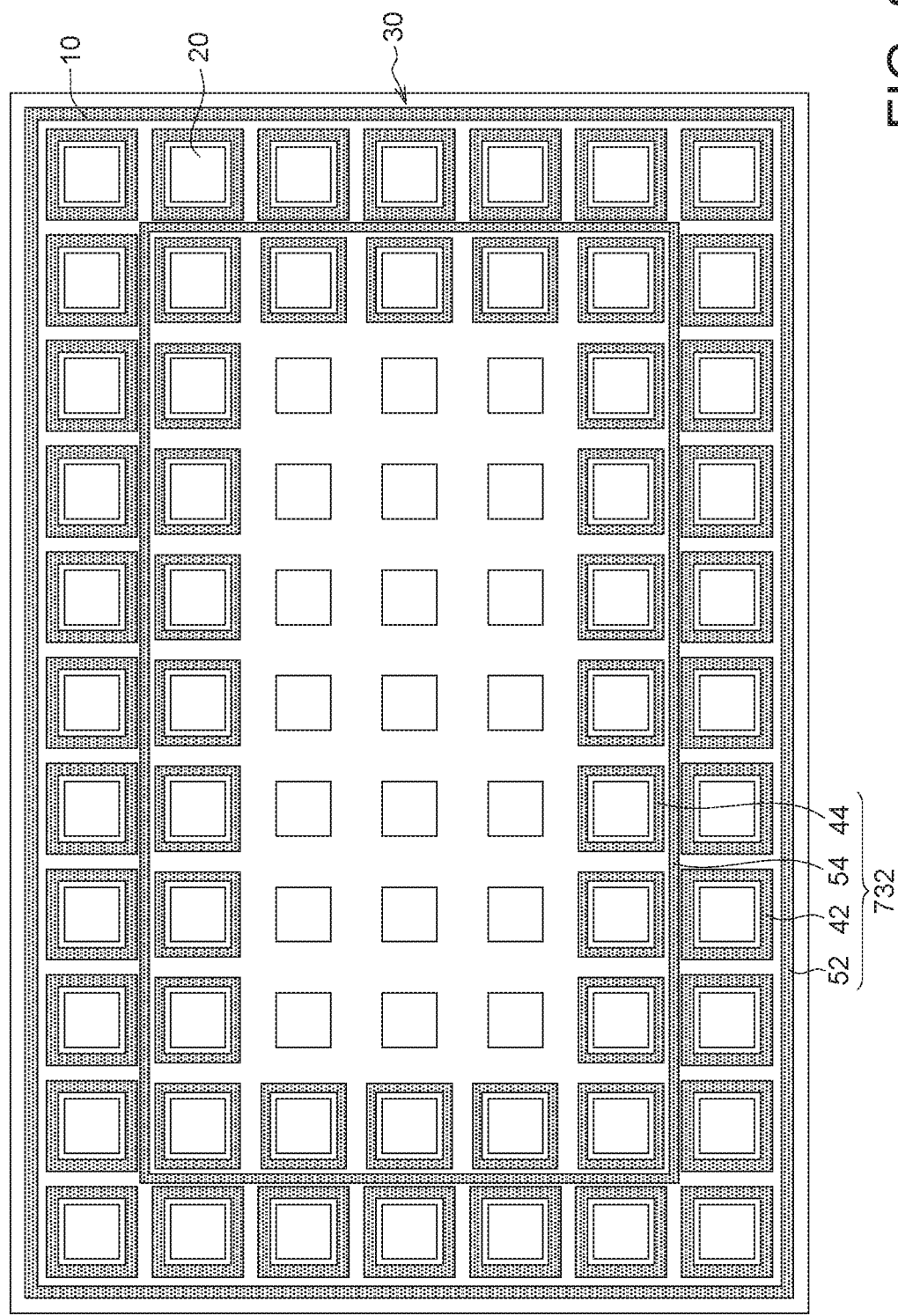
FIG. 8 is a top view of another panel to be plated.

Referring to FIG. 8, another panel 700 to be plated is shown. The panel 700 is different from the panel 500 mainly in the arrangement of the second patterns to be plated, and the similarities are not repeated here.

The second patterns 732 of the panel 700 also include a plurality of unit frame patterns (such as first unit frame patterns 42 and second unit frame patterns 44) and a plurality of peripheral frame patterns (such as first peripheral frame patterns 52 and second peripheral frame patterns 54). The unit frame patterns and the peripheral frame patterns of the second patterns 732 to be plated are arranged on the periphery of the units 20 to be plated closer to the edge of the substrate 10. In the electroplating process, the above arrangement is still beneficial for the compensation of the relatively strong electric field at the edges. In one embodiment, from the edge to the center of the substrate 10, the unit frame patterns may include a plurality of first unit frame patterns 42 and a plurality of second unit frame patterns 44, respectively surrounding corresponding units 20 to be plated. The wire widths of the first unit frame patterns 42 and the second unit frame patterns 44 diminish in order. Besides, from the edge to the center of the substrate 10, the peripheral frame patterns may include a first peripheral frame pattern 52 and a second peripheral frame pattern 54. The first peripheral frame pattern 52 and the second peripheral frame pattern 54 are correspondingly arranged outside the first unit frame patterns 42 and the second unit frame patterns 44. The wire widths of the first peripheral frame pattern 52 and the second peripheral frame pattern 54 diminish in order.

Figure 9:
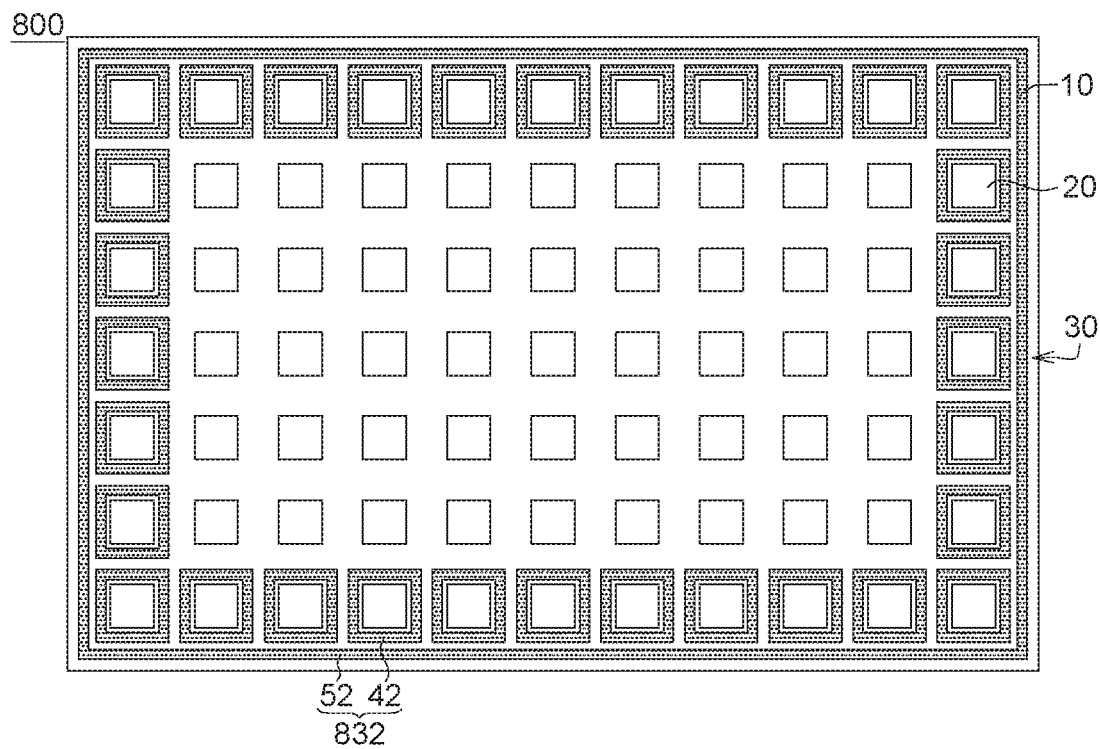
FIG. 9 is a top view of another panel to be plated.

Referring to FIG. 9, another panel 800 to be plated is shown. The panel 800 is different from the panel 500 mainly in the arrangement of the second patterns to be plated, and the similarities are not repeated here.

The second patterns 832 to be plated of the panel 800 include a plurality of unit frame patterns (such as first unit frame patterns 42) and a peripheral frame pattern (such as first peripheral frame patterns 52). The unit frame patterns and the peripheral frame patterns of the second patterns 732 to be plated are only arranged on the periphery of the units 20 to be plated closest to the edge of the substrate 10. In the electroplating process, the above arrangement is still beneficial for the compensation of the relatively strong electric field at the edges. In one embodiment, the unit frame patterns may include a plurality of first unit frame patterns 42 surrounding the units 20 to be plated closest to the edge of the substrate 10. Besides, the peripheral frame patterns may include a first peripheral frame pattern 52 are correspondingly arranged outside the first unit frame patterns 42.

Figure 10:
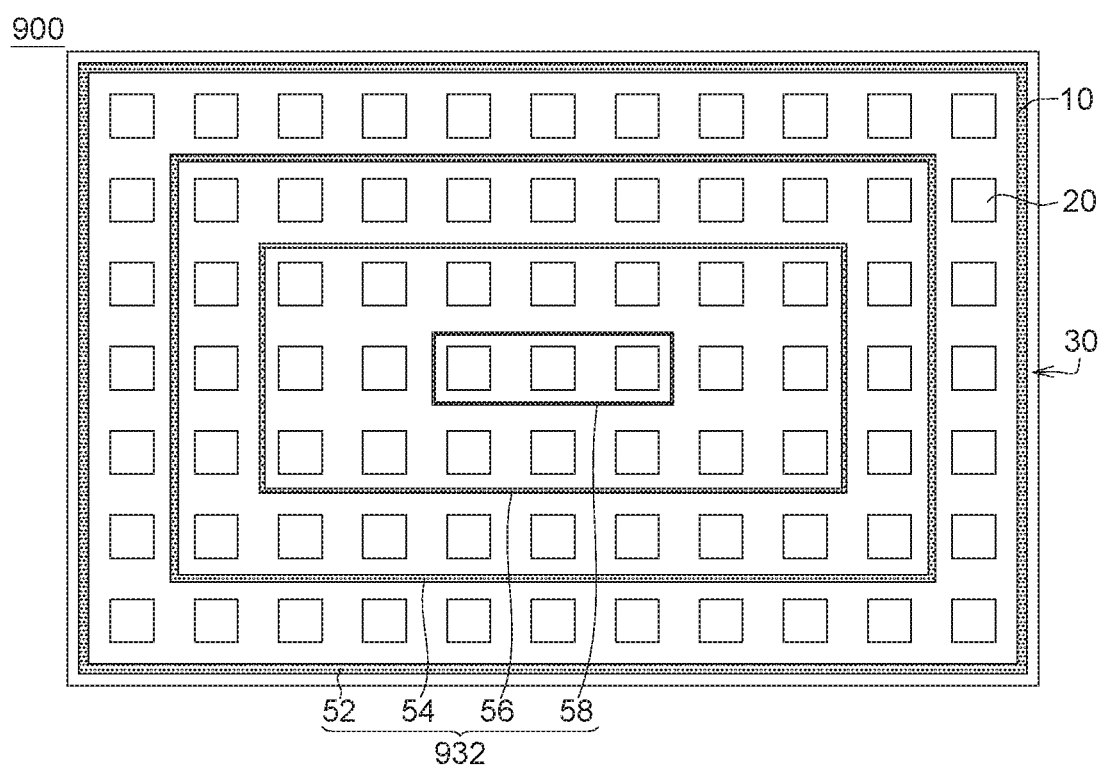
FIG. 10 is a top view of another panel to be plated.

Referring to FIG. 10, another panel 900 to be plated is shown. The panel 900 is different from the panel 500 of FIG. 6 mainly in the arrangement of the second patterns to be plated, and the similarities are not repeated here.

The second patterns 932 to be plated of the panel 900 do not include the unit frame patterns, but includes a plurality of peripheral frame patterns (such as first peripheral frame patterns 52, second peripheral frame patterns 54, third peripheral frame patterns 56, and fourth peripheral frame patterns 58) respectively surrounding many of the units 20 to be plated. The second patterns 932 to be plated are distributed over the entire substrate 10, and such arrangement is beneficial to the uniformity of the electric field in the electroplating process. Besides, the wire widths of the peripheral frame patterns may diminish in a direction from the edge towards the center of the substrate 10. In the electroplating process, the arrangement of diminishing wire widths is beneficial for the compensation of the relatively strong electric field at the edges. In one embodiment, the peripheral frame patterns may include a first peripheral frame pattern 52, a second peripheral frame pattern 54, a third peripheral frame pattern 56, and a fourth peripheral frame pattern 58, which are similar to that of the panel 500. The wire widths of the first peripheral frame pattern 52, the second peripheral frame pattern 54, the third peripheral frame pattern 56, and the fourth peripheral frame pattern 58 diminish in order.

Figure 11:
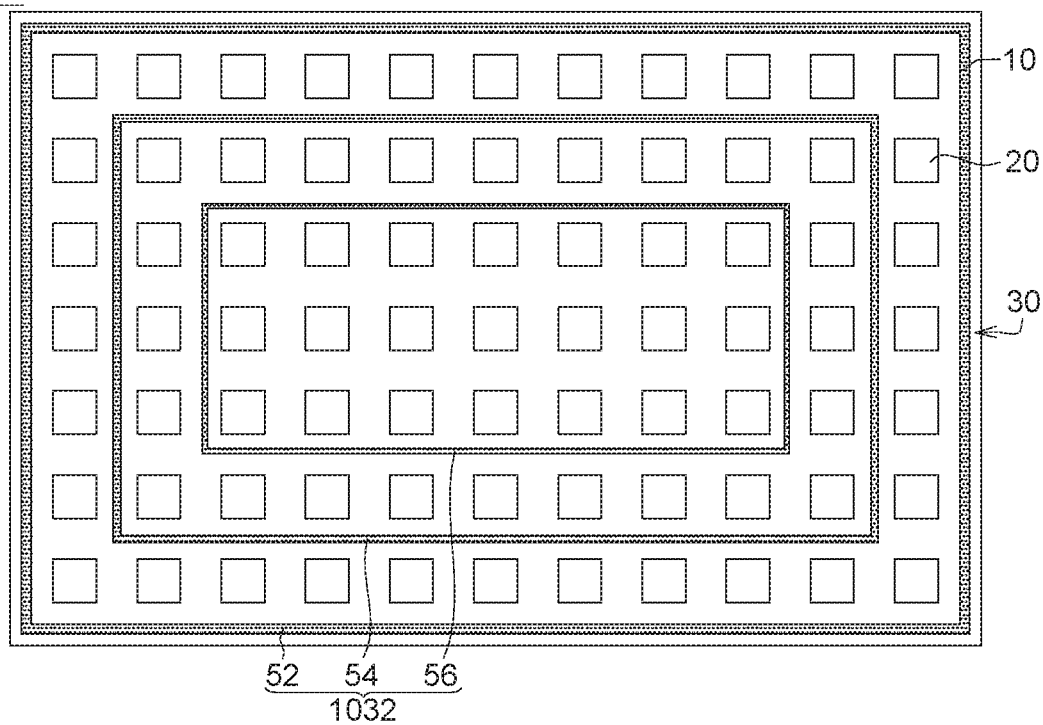
FIG. 11 is a top view of another panel to be plated.

Referring to FIG. 11, another panel 1000 to be plated is shown. The panel 1000 is different from the panel 900 mainly in the arrangement of the second patterns to be plated, and the similarities are not repeated here.

The second patterns 1032 to be plated of the panel 1000 includes a plurality of peripheral frame patterns (such as first peripheral frame patterns 52, second peripheral frame patterns 54, and third peripheral frame patterns 56) arranged on the peripheries of most units 20 to be plated except the units 20 to be plated disposed at the central region of the substrate 10. In the electroplating process, the above arrangement is still beneficial for the compensation of the relatively strong electric field at the edges. In one embodiment, from the edge to the center of the substrate 10, the peripheral frame patterns may include a first peripheral frame pattern 52, a second peripheral frame pattern 54, and a third peripheral frame pattern 56. The wire widths of the first peripheral frame pattern 52, the second peripheral frame pattern 54, and the third peripheral frame pattern 56 diminish in order.

Figure 12:
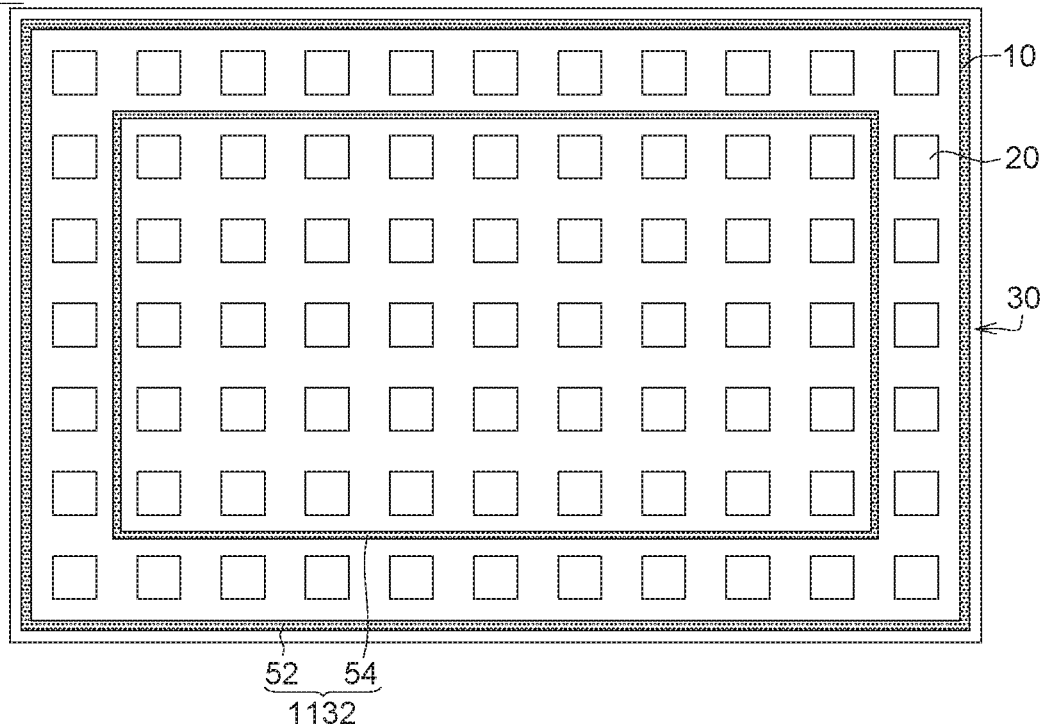
FIG. 12 is a top view of another panel to be plated.

Referring to FIG. 12, another panel 1100 to be plated is shown. The panel 1100 is different from the panel 900 mainly in the arrangement of the second patterns to be plated, and the similarities are not repeated here.

The second patterns 1132 to be plated of the panel 1100 includes a plurality of peripheral frame patterns (such as first peripheral frame patterns 52 and second peripheral frame patterns 54) arranged on the periphery of the units 20 to be plated closer to the edge of the substrate 10. In the electroplating process, the above arrangement is still beneficial for the compensation of the relatively strong electric field at the edges. In one embodiment, from the edge to the center of the substrate 10, the peripheral frame patterns may include a first peripheral frame pattern 52 and a second peripheral frame pattern 54. The wire widths of the first peripheral frame pattern 52 and the second peripheral frame pattern 54 diminish in order. It can be understood that in some other embodiments, only the outmost first peripheral frame pattern 52 is arranged.

Figure 13:
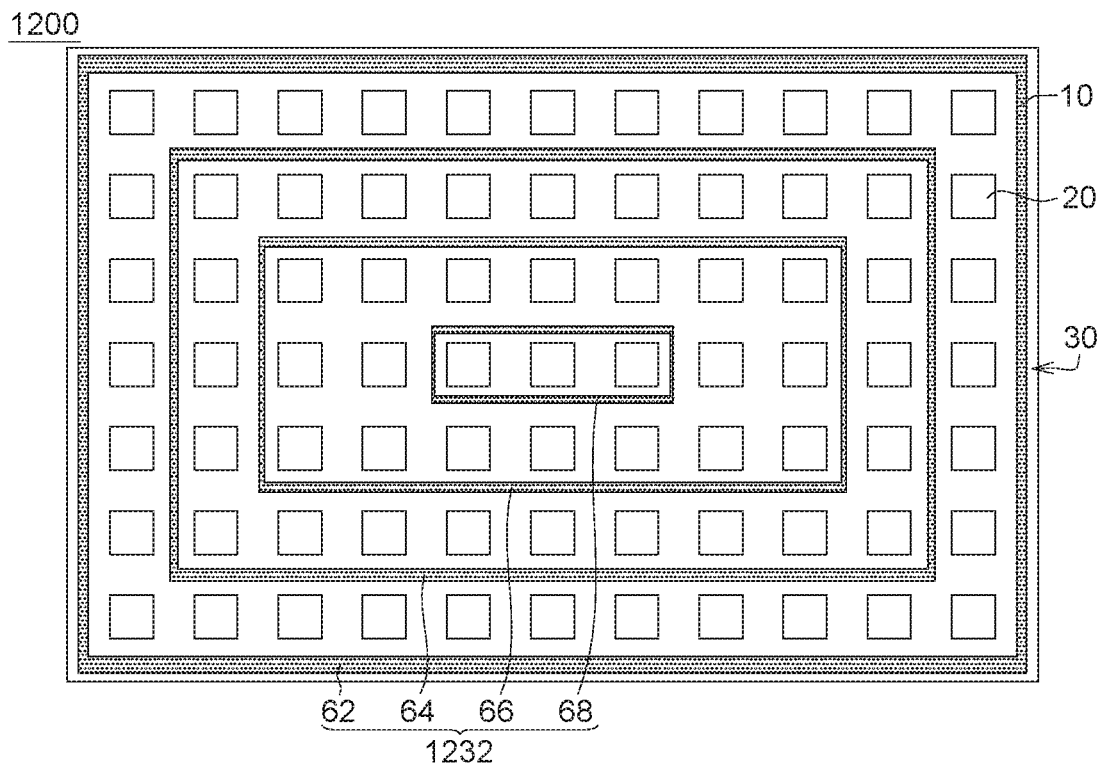
FIG. 13 is a top view of another panel to be plated.

Referring to FIG. 13, another panel 1200 to be plated is shown. The panel 1200 is different from the panel 900 of FIG. 10 mainly in the arrangement of the second patterns to be plated and the similarities are not repeated here.

The second patterns 1232 to be plated of the panel 1200 also includes a plurality of peripheral frame patterns (such as first peripheral frame patterns 62, second peripheral frame patterns 64, third peripheral frame patterns 66, and fourth peripheral frame patterns 68) respectively surrounding many of the units 20 to be plated. The second patterns 1232 to be plated are distributed over the entire substrate 10, and such arrangement is beneficial to the uniformity of the electric field in the electroplating process. Each peripheral frame pattern (such as the first peripheral frame pattern 52, second peripheral frame pattern 54, third peripheral frame pattern 56, or fourth peripheral frame patterns 58) of the second patterns 932 to be plated of the panel 900 has a constant wire width. In contrast, the wire width of each peripheral frame pattern (such as first peripheral frame patterns 62, second peripheral frame patterns 64, third peripheral frame patterns 66, and fourth peripheral frame patterns 68) of the second patterns 1232 to be plated of the panel 1200 along the longer side direction of the substrate 10 is larger than that along the shorter side direction of the substrate 10. Therefore, the difference between the electric field along the longer side and that along the shorter side of the substrate 10 can be compensated. Besides, the wire widths of the peripheral frame patterns may diminish in a direction from the edge towards the center of the substrate 10. In the electroplating process, the arrangement of diminishing wire widths is beneficial for the compensation of the relatively strong electric field at the edges. In one embodiment, the peripheral frame patterns may include a first peripheral frame pattern 62, a second peripheral frame pattern 64, a third peripheral frame pattern 66, and a fourth peripheral frame pattern 68. The first peripheral frame pattern 62, the second peripheral frame pattern 64, the third peripheral frame pattern 66, and the fourth peripheral frame pattern 68 respectively have a wire width larger in the longer side direction but smaller in the shorter side direction. Here, the longer side direction and the shorter side direction of the substrate 10 are also the longer side direction and the shorter side direction of the peripheral frame patterns. The wire widths of the first peripheral frame pattern 62, the second peripheral frame pattern 64, the third peripheral frame pattern 66, and the fourth peripheral frame pattern 68 diminish in order.

Figure 14:
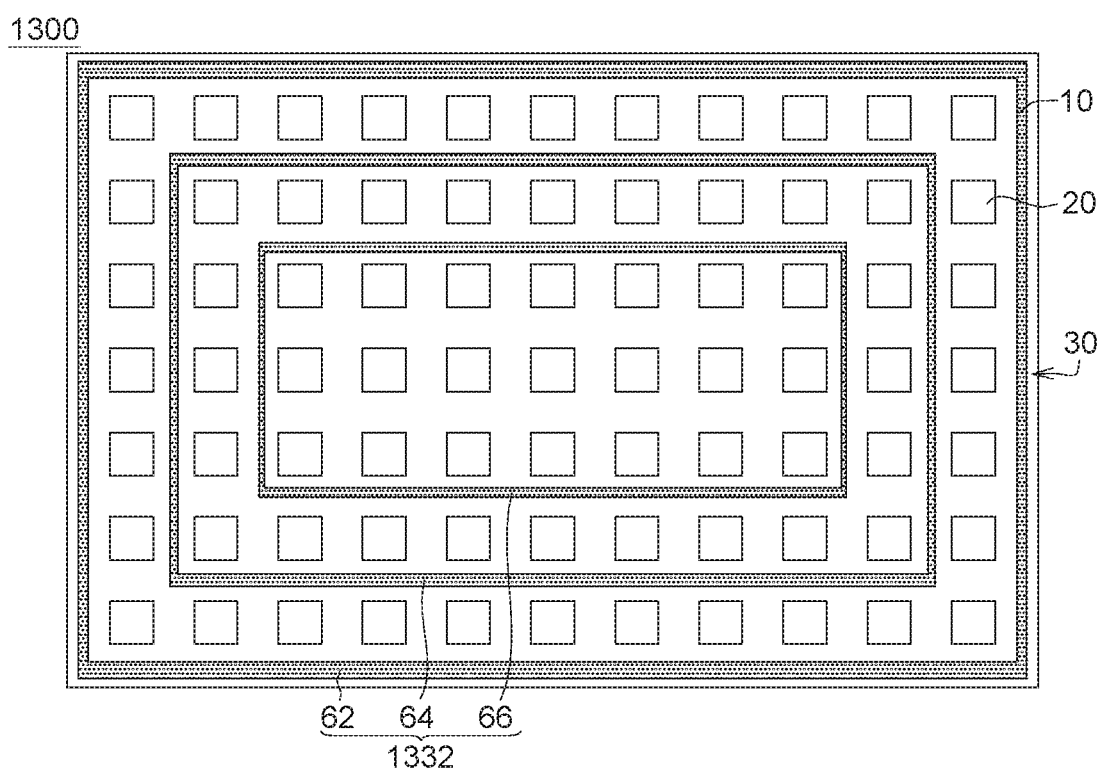
FIG. 14 is a top view of another panel to be plated.

Referring to FIG. 14, another panel 1300 to be plated is shown. The panel 1300 is different from the panel 1200 mainly in the arrangement of the second patterns to be plated, and the similarities are not repeated here.

The second patterns 1332 to be plated of the panel 1300 also includes a plurality of peripheral frame patterns (such as first peripheral frame patterns 62, second peripheral frame patterns 64, and third peripheral frame patterns 66) respectively surrounding many of the units 20 to be plated. The peripheral frame patterns of the second patterns 1332 to be plated are arranged on the periphery of most units 20 to be plated but the units 20 to be plated at the central region of the substrate 10. In the electroplating process, the above arrangement is still beneficial for the compensation of the relatively strong electric field at the edges. The wire width of each peripheral frame pattern (such as a first peripheral frame pattern 62, second peripheral frame pattern 64, third peripheral frame pattern 66, or fourth peripheral frame pattern 68) along the longer side direction of the substrate 10 is larger than that along the shorter side direction of the substrate 10. Therefore, the difference between the electric field along the longer side and that along the shorter side of the substrate 10 can be compensated. The wire widths of the peripheral frame patterns may diminish in a direction from the edge towards the center of the substrate 10. In the electroplating process, the arrangement of diminishing wire widths is beneficial for the compensation of the relatively strong electric field at the edges. In one embodiment, the peripheral frame patterns may include a first peripheral frame pattern 62, a second peripheral frame pattern 64, and a third peripheral frame pattern 66. The first peripheral frame pattern 62, the second peripheral frame pattern 64, and the third peripheral frame pattern 66 respectively have a wire width larger in the longer side direction but smaller in the shorter side direction. The wire widths of the first peripheral frame pattern 62, the second peripheral frame pattern 64, and the third peripheral frame pattern 66 diminish in order.

Figure 15:
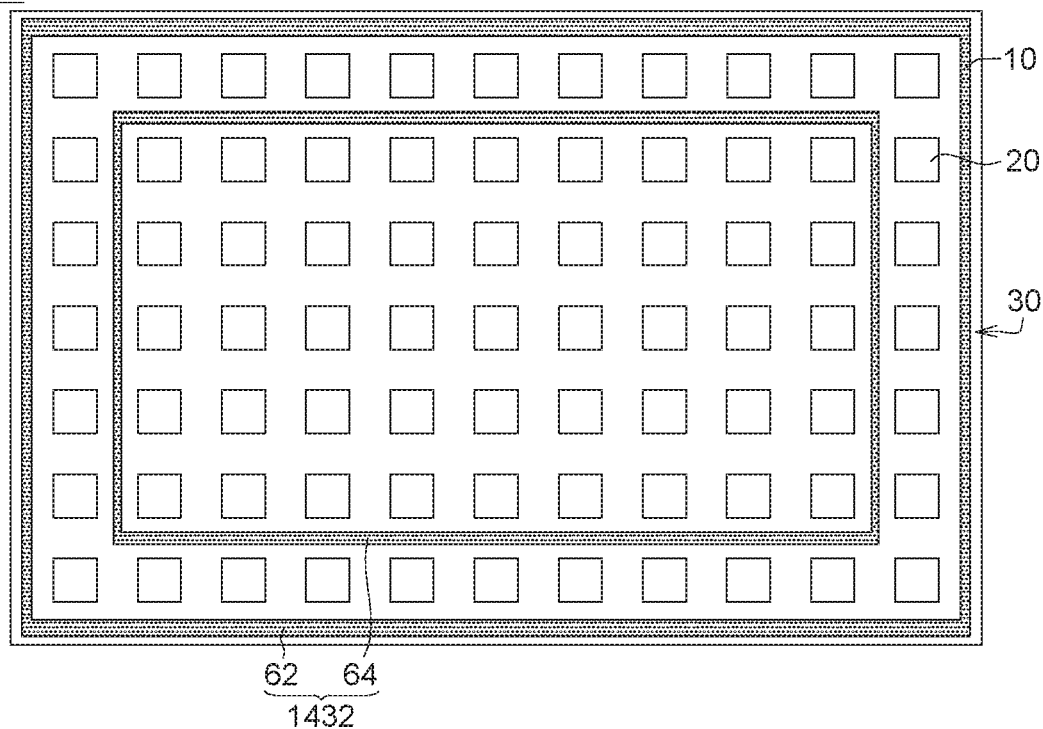
FIG. 15 is a top view of another panel to be plated.

Referring to FIG. 15, another panel 1400 to be plated is shown. The panel 1400 is different from the panel 1200 mainly in the arrangement of the second patterns to be plated, and the similarities are not repeated here.

The second patterns 1432 to be plated of the panel 1400 also include a plurality of peripheral frame patterns (such as first peripheral frame patterns 62 and second peripheral frame patterns 64) respectively surrounding many of the units 20 to be plated. The peripheral frame patterns of the second patterns 1432 to be plated are arranged on the periphery of the units 20 to be plated closer to the edge of the substrate 10. In the electroplating process, the above arrangement is still beneficial for the compensation of the relatively strong electric field at the edges. The wire width of each peripheral frame pattern (such as a first peripheral frame pattern 62 or second peripheral frame pattern 64) along the longer side direction of the substrate 10 is larger than that along the shorter side direction of the substrate 10. Therefore, the difference between the electric field along the longer side and that along the shorter side of the substrate 10 can be compensated. The wire widths of the peripheral frame patterns may diminish in a direction from the edge towards the center of the substrate 10. In the electroplating process, the arrangement of diminishing wire widths is beneficial for the compensation of the relatively strong electric field at the edges. In one embodiment, the peripheral frame patterns may include a first peripheral frame pattern 62 and a second peripheral frame pattern 64. The first peripheral frame pattern 62 and the second peripheral frame pattern 64 respectively have a wire width larger in the longer side direction but smaller in the shorter side direction. The wire widths of the first peripheral frame pattern 62 and the second peripheral frame pattern 64 diminish in order. It can be understood that in some other embodiments, only the outmost first peripheral frame pattern 62 is arranged.

Figure 16:
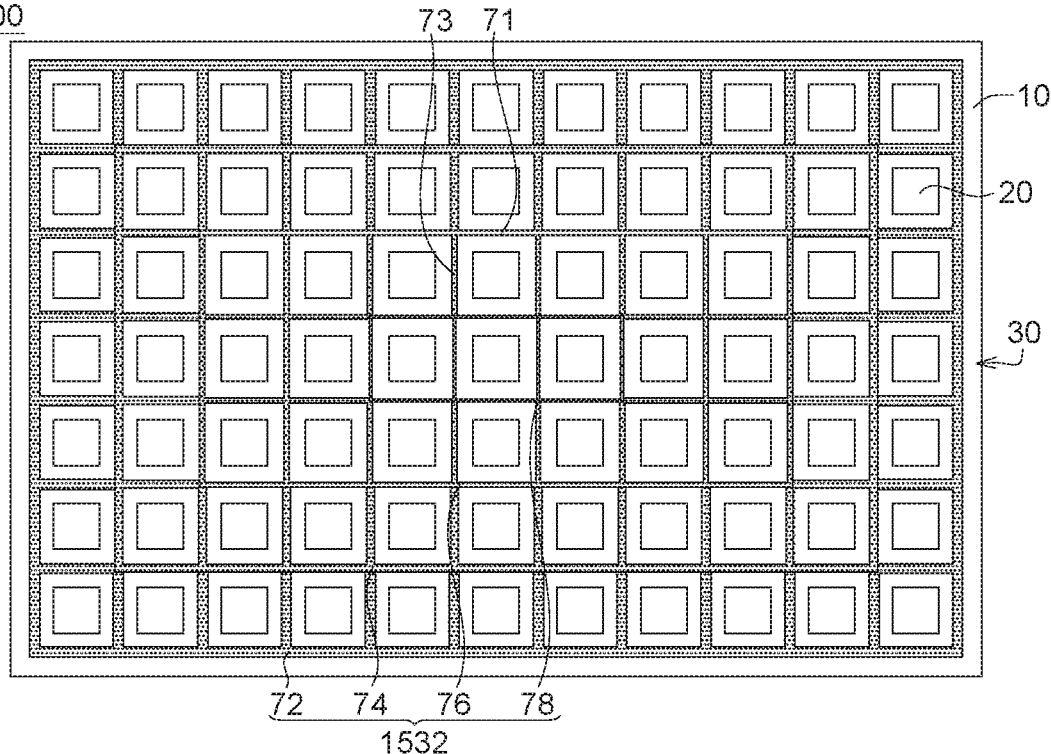
FIG. 16 is a top view of another panel to be plated.

Referring to FIG. 16, another panel 1500 to be plated is shown. The panel 1500 is different from the panel 900 of FIG. 10 mainly in the arrangement of the second patterns to be plated and the similarities are not repeated here.

The second patterns 1532 to be plated of the panel 1500 includes a plurality of peripheral frame patterns (such as first peripheral frame patterns 72, second peripheral frame patterns 74, third peripheral frame patterns 76, and fourth peripheral frame patterns 78) respectively surrounding many of the units 20 to be plated. The second patterns 1532 to be plated are distributed over the entire substrate 10, and such arrangement is beneficial to the uniformity of the electric field in the electroplating process. The second patterns 1532 to be plated the peripheral frame patterns of include a trunk portion 71 and a plurality of comb portion 73 extended towards the center of the substrate 10 for the trunk portion 71. Therefore, in comparison to the second patterns 932 to be plated of the panel 900, the second patterns 1532 to be plated of the panel 1500 are more beneficial to the uniformity of the electric field in the electroplating process. Besides, the wire widths of the peripheral frame patterns may diminish in a direction from the edge towards the center of the substrate 10. In the electroplating process, the arrangement of diminishing wire widths is beneficial for the compensation of the relatively strong electric field at the edges. In one embodiment, the peripheral frame patterns may include a first peripheral frame pattern 72, a second peripheral frame pattern 74, a third peripheral frame pattern 76, and a fourth peripheral frame pattern 78, arranged from the edge towards the center of the substrate 10, wherein the comb portion 73 of a peripheral frame pattern can be connected to the trunk portion 71 of its subsequent peripheral frame pattern. The wire widths of the first peripheral frame pattern 72, the second peripheral frame pattern 74, the third peripheral frame pattern 76, and the fourth peripheral frame pattern 78 diminish in order.

Figure 17:
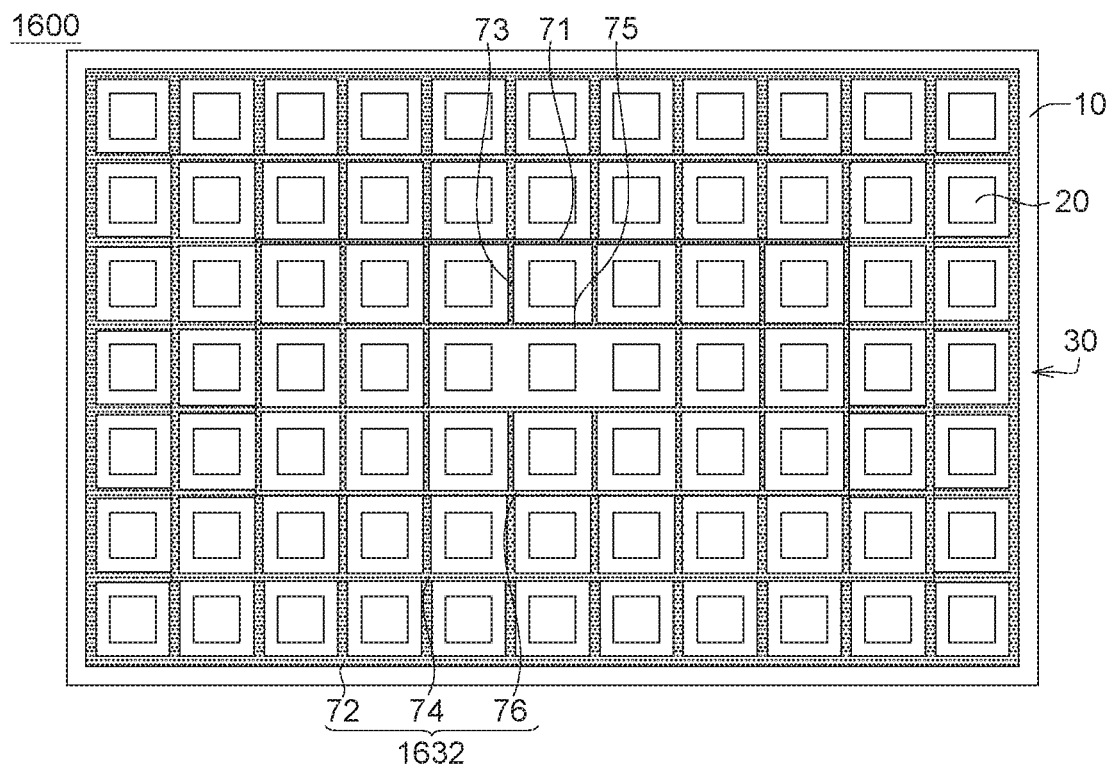
FIG. 17 is a top view of another panel to be plated.

Referring to FIG. 17, another panel 1600 to be plated is shown. The panel 1600 is different from the panel 1500 mainly in the arrangement of the second patterns to be plated and the similarities are not repeated here.

The second patterns 1632 to be plated of the panel 1600 includes a plurality of peripheral frame patterns (such as first peripheral frame patterns 72, second peripheral frame patterns 74, and third peripheral frame patterns 76) respectively surrounding many of the units 20 to be plated. The peripheral frame patterns of the second patterns 1632 to be plated are arranged on the periphery of most units 20 to be plated but the units 20 to be plated at the central region of the substrate 10. In the electroplating process, the above arrangement is still beneficial for the compensation of the relatively strong electric field at the edges. At least one peripheral frame pattern of the second patterns 1632 to be plated further includes a plurality of connecting portions 75 connecting the comb portions 73. The wire widths of the peripheral frame patterns may diminish in a direction from the edge towards the center of the substrate 10. In the electroplating process, the arrangement of diminishing wire widths is beneficial for the compensation of the relatively strong electric field at the edges. In one embodiment, the peripheral frame patterns may include a first peripheral frame pattern 72, a second peripheral frame pattern 74, and a third peripheral frame pattern 76, arranged from the edge towards the center of the substrate 10, wherein the comb portion 73 of a peripheral frame pattern can be connected to the trunk portion 71 of its subsequent peripheral frame pattern. While the first peripheral frame pattern 72 and the second peripheral frame pattern 74 respectively include the trunk portion 71 and the comb portion 73 only, the third peripheral frame pattern 76 further includes a connecting portion 75 in addition to the trunk portion 71 and the comb portion 73. The wire widths of the first peripheral frame pattern 72, the second peripheral frame pattern 74, and the third peripheral frame pattern 76 diminish in order.

Figure 18:
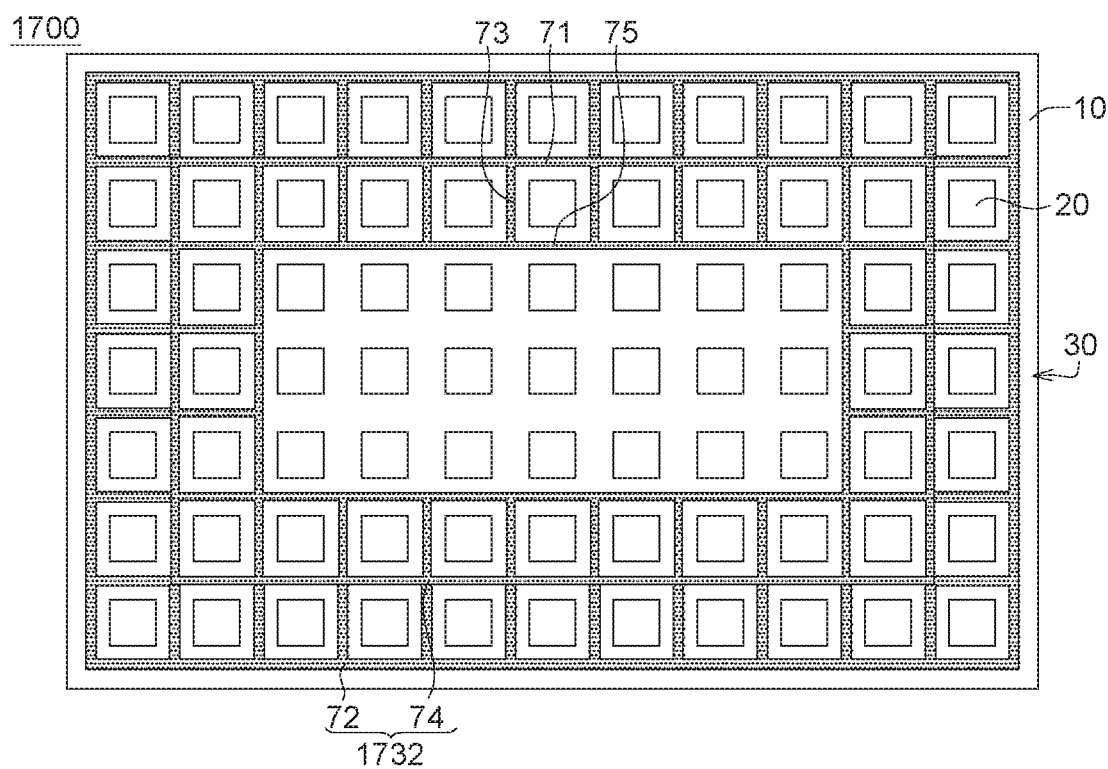
FIG. 18 is a top view of another panel to be plated.

Referring to FIG. 18, another panel 1700 to be plated is shown. The panel 1700 is different from the panel 1500 mainly in the arrangement of the second patterns to be plated and the similarities are not repeated here.

The second patterns 1732 to be plated of the panel 1700 include a plurality of peripheral frame patterns (such as first peripheral frame patterns 72 and second peripheral frame patterns 74) respectively surrounding many of the units 20 to be plated. The peripheral frame patterns of the second patterns 1732 to be plated are arranged on the periphery of the units 20 to be plated closer to the edge of the substrate 10. In the electroplating process, the above arrangement is still beneficial for the compensation of the relatively strong electric field at the edges. At least one peripheral frame pattern of the second patterns 1732 to be plated further include a plurality of connecting portions 75 connecting the comb portions 73. The wire widths of the peripheral frame patterns may diminish in a direction from the edge towards the center of the substrate 10. In the electroplating process, the arrangement of diminishing wire widths is beneficial for the compensation of the relatively strong electric field at the edges. In one embodiment, the peripheral frame patterns may include a first peripheral frame pattern 72 and a second peripheral frame pattern 74, arranged from the edge towards the center of the substrate 10, wherein the comb portion 73 of a peripheral frame pattern can be connected to the trunk portion 71 of its subsequent peripheral frame pattern. While the first peripheral frame pattern 72 only includes the trunk portion 71 and the comb portion 73, the second peripheral frame pattern 74 further includes a connecting portion 75 in addition to the trunk portion 71 and the comb portion 73. The wire widths of the first peripheral frame pattern 72 and the second peripheral frame pattern 74 diminish in order.

Figure 19:
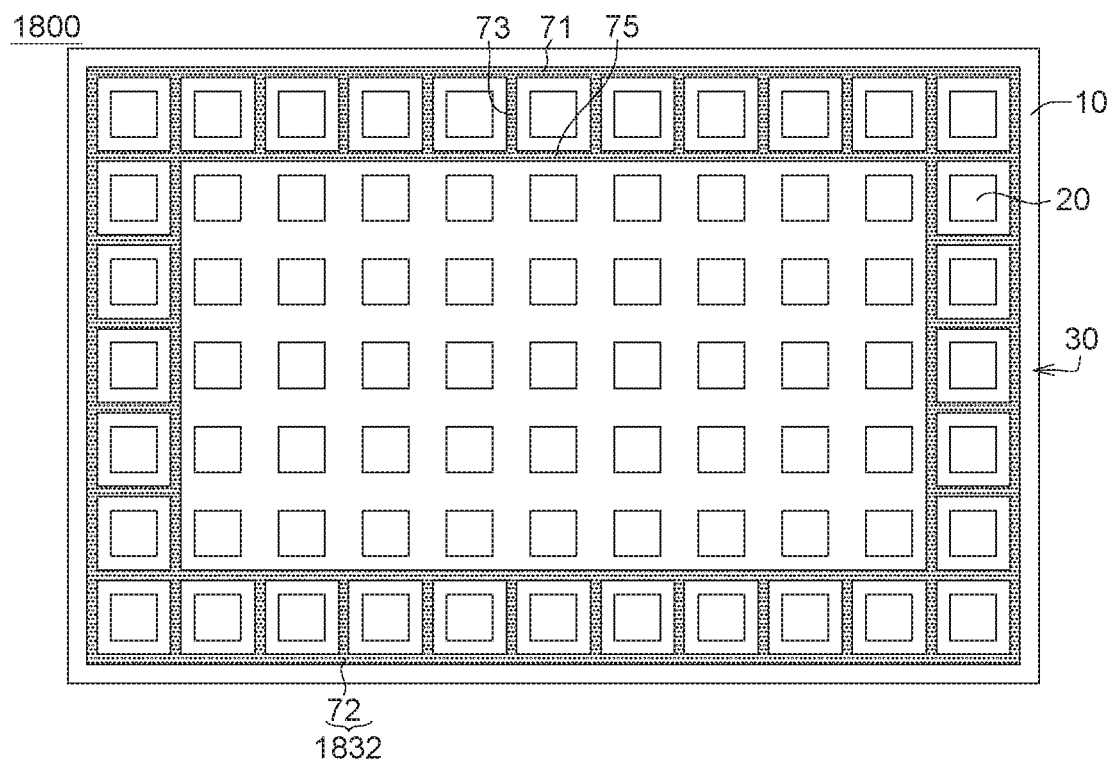
FIG. 19 is a top view of another panel to be plated.

Referring to FIG. 19, another panel 1800 to be plated is shown. The panel 1800 is different from the panel 1500 mainly in the arrangement of the second patterns to be plated and the similarities are not repeated here.

The second patterns 1832 to be plated of the panel 1800 includes a peripheral frame pattern (such as a first peripheral frame pattern 72) surrounding many of the units 20 to be plated. The peripheral frame patterns of the second patterns 1832 to be plated are only arranged on the periphery of the units 20 to be plated closest to the edge of the substrate 10. In the electroplating process, the above arrangement is still beneficial for the compensation of the relatively strong electric field at the edges. In one embodiment, the peripheral frame patterns may include a first peripheral frame pattern 72. The first peripheral frame pattern 72 further includes a connecting portion 75 in addition to the trunk portion 71 and the comb portion 73.

Figure 20:
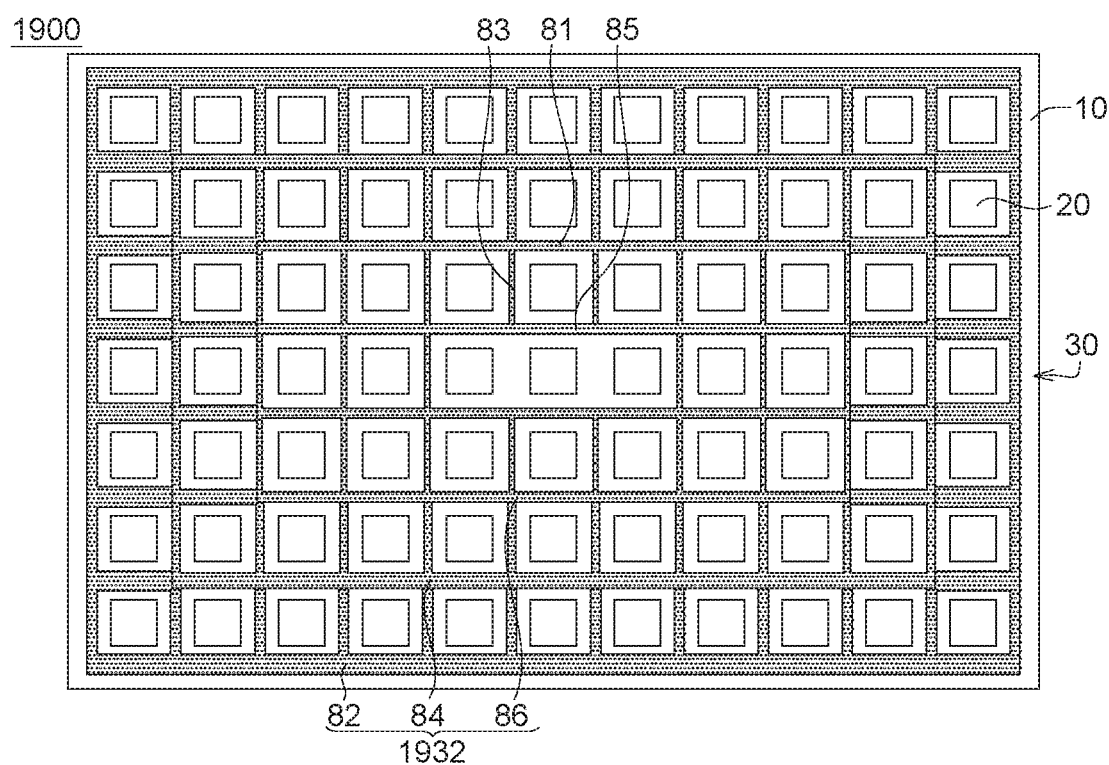
FIG. 20 is a top view of another panel to be plated.

Referring to FIG. 20, another panel 1900 is shown. The panel 1900 is different from the panel 1600 of FIG. 17 mainly in the arrangement of the second patterns to be plated, and the similarities are not repeated here.

The second patterns 1932 to be plated of the panel 1900 also includes a plurality of peripheral frame patterns (such as first peripheral frame patterns 82, second peripheral frame patterns 84, and third peripheral frame patterns 86) respectively surrounding many of the units 20 to be plated. The peripheral frame patterns of the second patterns 1932 to be plated are arranged on the periphery of most units 20 to be plated but the units 20 to be plated at the central region of the substrate 10. In the electroplating process, the above arrangement is still beneficial for the compensation of the relatively strong electric field at the edges. Of the second patterns 1632 to be plated of the panel 1600, each peripheral frame pattern (such as the first peripheral frame pattern 72, second peripheral frame pattern 74, or third peripheral frame pattern 76) has a constant wire width. In comparison, the wire width of each peripheral frame pattern (such as a first peripheral frame pattern 82, second peripheral frame pattern 84, and third peripheral frame pattern 86) of the second patterns 1932 to be plated of the panel 1900 along the longer side direction of the substrate 10 is larger than that along the shorter side direction of the substrate 10. Therefore, the difference between the electric field along the longer side and that along the shorter side of the substrate 10 can be compensated. Besides, the wire widths of the peripheral frame patterns may diminish in a direction from the edge towards the center of the substrate 10. In the electroplating process, the arrangement of diminishing wire widths is beneficial for the compensation of the relatively strong electric field at the edges. In one embodiment, the peripheral frame patterns may include a first peripheral frame pattern 82, a second peripheral frame pattern 84, and a third peripheral frame pattern 86. The first peripheral frame pattern 82, the second peripheral frame pattern 84, and the third peripheral frame pattern 86 respectively have a wire width larger in the longer side direction but smaller in the shorter side direction. Here, the longer side direction and the shorter side direction of the substrate 10 are also the longer side direction and the shorter side direction of the peripheral frame patterns. That is, for each peripheral frame pattern, the wire width of the trunk portion 81 (and the connecting portion 85) is larger than that of the comb portion 83. Besides, if the peripheral frame patterns include the connecting portion 85, such as the third peripheral frame pattern 86 of the second patterns 1932 to be plated, the wire width of the trunk portion 81 can be larger than that of the connecting portion 85. The wire widths of the first peripheral frame pattern 82, the second peripheral frame pattern 84, and the third peripheral frame pattern 86 diminish in order.

Figure 21:
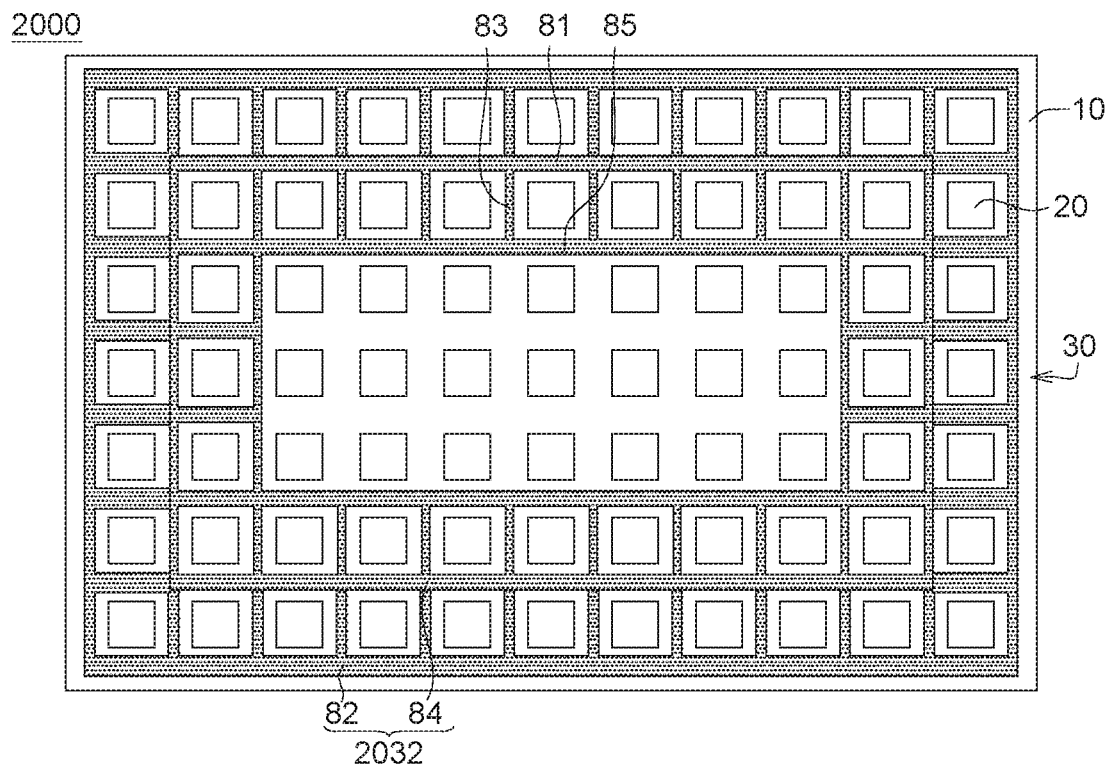
FIG. 21 is a top view of another panel to be plated.

Referring to FIG. 21, another panel 2000 to be plated is shown. The panel 2000 is different from the panel 1900 mainly in the arrangement of the second patterns to be plated, and the similarities are not repeated here.

The second patterns 2032 to be plated of the panel 2000 also includes a plurality of peripheral frame patterns (such as first peripheral frame patterns 82 and second peripheral frame patterns 84) respectively surrounding many of the units 20 to be plated. The peripheral frame patterns of the second patterns 2032 to be plated are arranged on the periphery of the units 20 to be plated closer to the edge of the substrate 10. In the electroplating process, the above arrangement is still beneficial for the compensation of the relatively strong electric field at the edges. The wire width of each peripheral frame pattern (such as a first peripheral frame patterns 82 or second peripheral frame patterns 84) of the second patterns 2032 to be plated of the panel 2000 along the longer side direction of the substrate 10 is larger than that along the shorter side direction of the substrate 10. Therefore, the difference between the electric field along the longer side and that along the shorter side of the substrate 10 can be compensated. Besides, the wire widths of the peripheral frame patterns may diminish in a direction from the edge towards the center of the substrate 10. In the electroplating process, the arrangement of diminishing wire widths is beneficial for the compensation of the relatively strong electric field at the edges. In one embodiment, the peripheral frame patterns may include a first peripheral frame pattern 82 and a second peripheral frame pattern 84. The first peripheral frame pattern 82 and the second peripheral frame pattern 84 respectively have a wire width larger in the longer side direction but smaller in the shorter side direction. The wire widths of the first peripheral frame pattern 82 and the second peripheral frame pattern 84 diminish in order.

Figure 22:
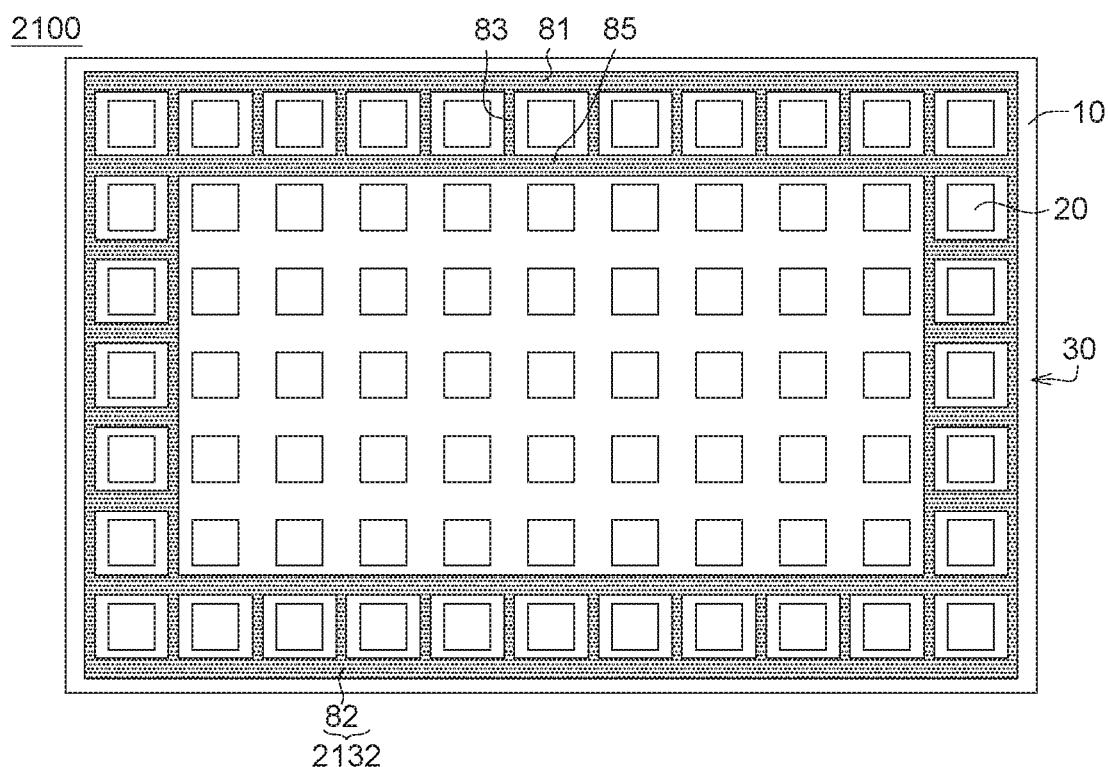
FIG. 22 is a top view of another panel to be plated.

Referring to FIG. 22, another panel 2100 to be plated is shown. The panel 2100 is different from the panel 1900 mainly in the arrangement of the second patterns to be plated, and the similarities are not repeated here.

The second patterns 2132 to be plated of the panel 2100 includes a peripheral frame pattern (such as a first peripheral frame pattern 82) surrounding many of the units 20 to be plated. The peripheral frame patterns of the second patterns 2132 to be plated are only arranged on the periphery of the units 20 to be plated closest to the edge of the substrate 10. In the electroplating process, the above arrangement is still beneficial for the compensation of the relatively strong electric field at the edges. The wire width of the peripheral frame pattern (such as a first peripheral frame pattern 82) of the second patterns 2132 to be plated of the panel 2100 along the longer side direction of the substrate 10 is larger than that along the shorter side direction of the substrate 10. Therefore, the difference between the electric field along the longer side and that along the shorter side of the substrate 10 can be compensated. In one embodiment, the peripheral frame patterns may include a first peripheral frame pattern 82. The first peripheral frame pattern 82 has a wire width larger in the longer side direction but smaller in the shorter side direction.

Figure 23:
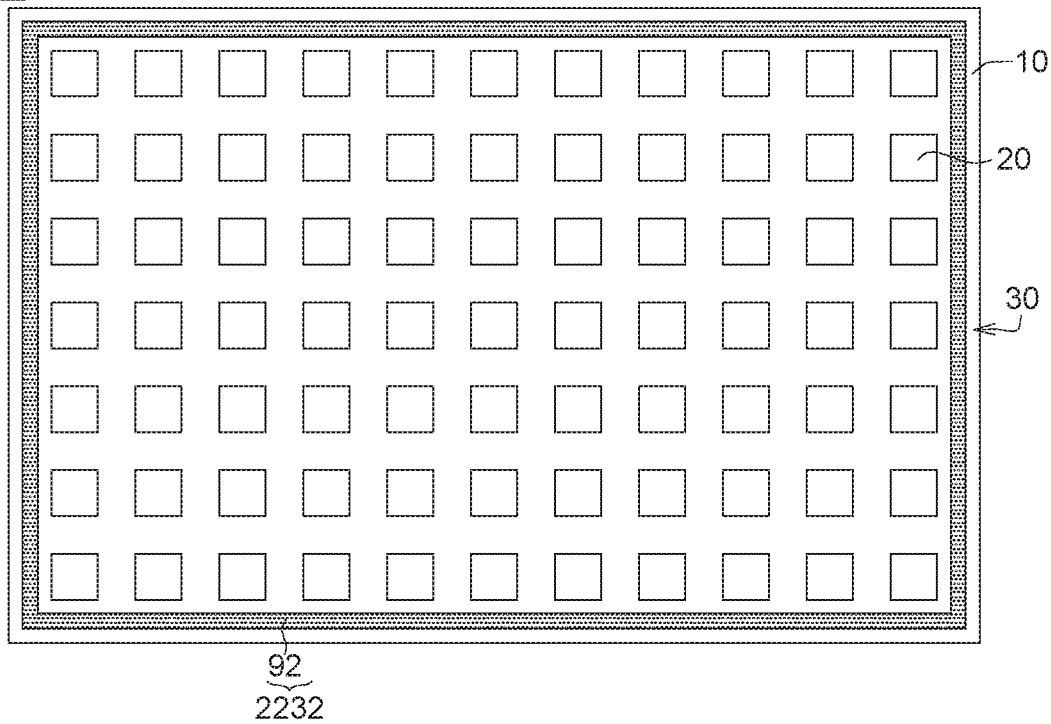
FIG. 23 is a top view of another panel to be plated.

Referring to FIG. 23, another panel 2200 to be plated is shown. The panel 2200 is different from the panel 100 of FIG. 1 mainly in the arrangement of the second patterns to be plated, and the similarities are not repeated here.

The second patterns 2232 to be plated of the panel 2200 include a peripheral frame pattern 92 arranged on the edge of the substrate 10 and surrounding all units 20 to be plated. In the electroplating process, the above arrangement is still beneficial for the compensation of the relatively strong electric field at the edges. In the panel 2200, a ratio of an area of the first patterns 22 to be plated of the units 20 to be plated to an area of the peripheral frame pattern 92 of the electric field compensation structure 30 is in a range from 1:0.07 to 1:0.3. However, when the peripheral frame pattern 92 and the second patterns to be plated disclosed in any of the above embodiments are used together, a ratio of a total area of the first patterns 22 to be plated of the units 20 to be plated to a sum of an area of the peripheral frame pattern 92 of the electric field compensation structure 30 and an area of other parts forming the second patterns to be plated is in a range from 1:0.07 to 1:0.3.

Figure 24:
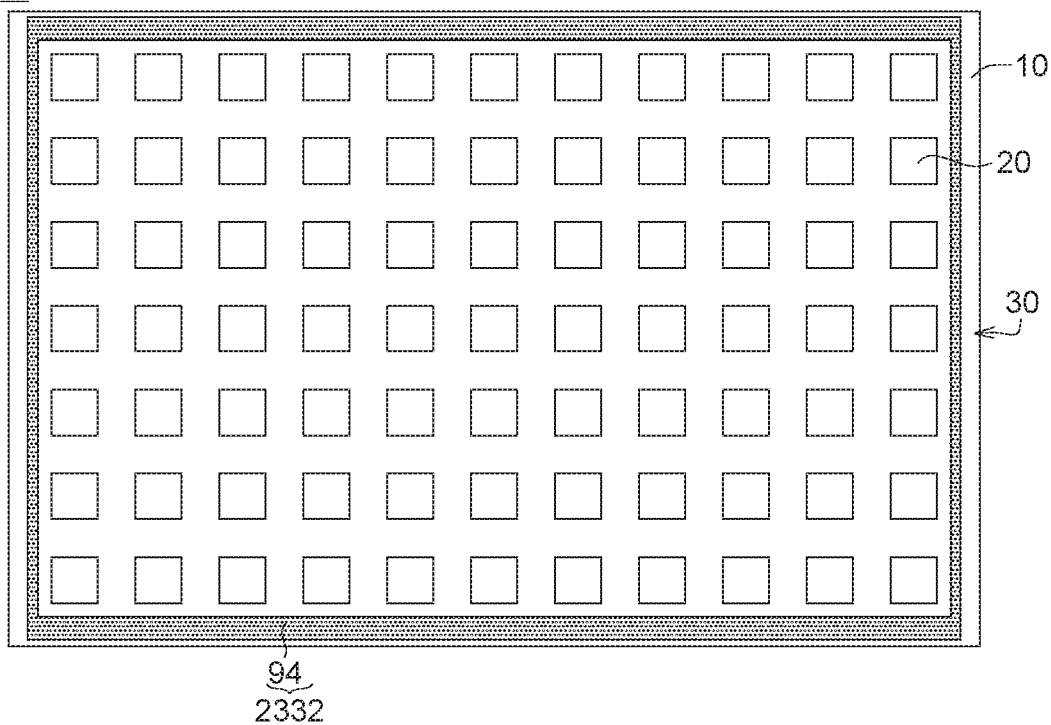
FIG. 24 is a top view of another panel to be plated.

Referring to FIG. 24, another panel 2300 to be plated is shown. The panel 2300 is different from the panel 2200 mainly in the arrangement of the second patterns to be plated, and the similarities are not repeated here.

The second patterns 2332 to be plated of the panel 2300 includes a peripheral frame pattern 94 arranged along the edge of the substrate 10 and surrounding all units 20 to be plated. In the electroplating process, the above arrangement is still beneficial for the compensation of the relatively strong electric field at the edges. Of the second patterns 2232 to be plated of the panel 2200, the peripheral frame pattern 92 has a constant wire width. In comparison, the wire width of the peripheral frame pattern 94 of the second patterns 2332 to be plated of the panel 2300 along the longer side direction of the substrate 10 is larger than that along the shorter side direction of the substrate 10. Therefore, the difference between the electric field along the longer side and that along the shorter side of the substrate 10 can be compensated. Such difference in the wire width can be achieved by increasing the wire width of the peripheral frame pattern 94 in the longer side direction and/or decreasing the wire width of the peripheral frame pattern 94 in the shorter side direction.

Various embodiments of the panel to be plated of the present invention are already disclosed above. It can be understood that the second patterns to be plated provided in above embodiments can be used together to generate another embodiment of the electric field compensation structure. For example, the peripheral frame patterns can be used together with the unit frame patterns and/or the peripheral frame patterns and arranged outside these patterns.

Figure 25:
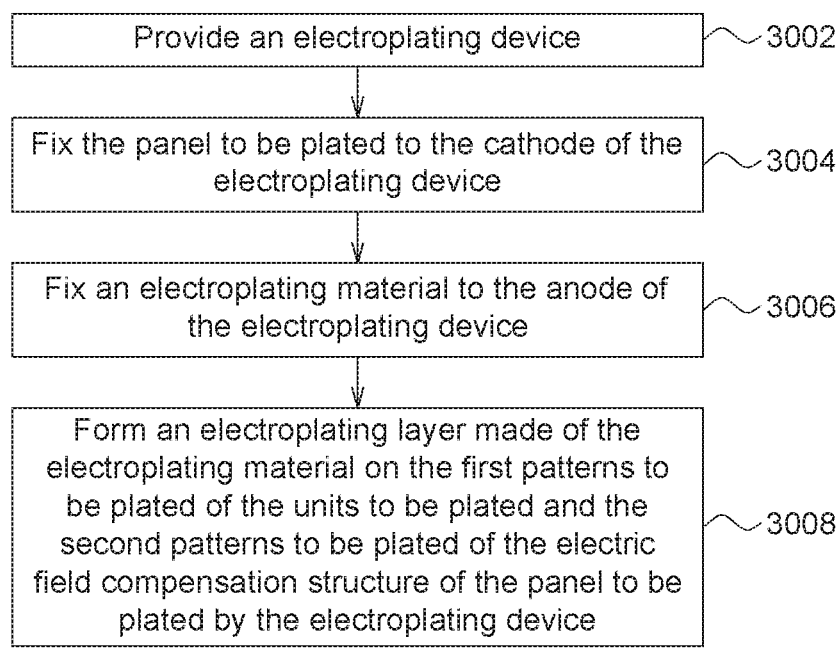
FIG. 25 is a flowchart of an electroplating process.

Another embodiment of the present invention relates to an electroplating process. Referring to FIG. 25, a flowchart of an electroplating process 3000 is shown.

Figure 26:
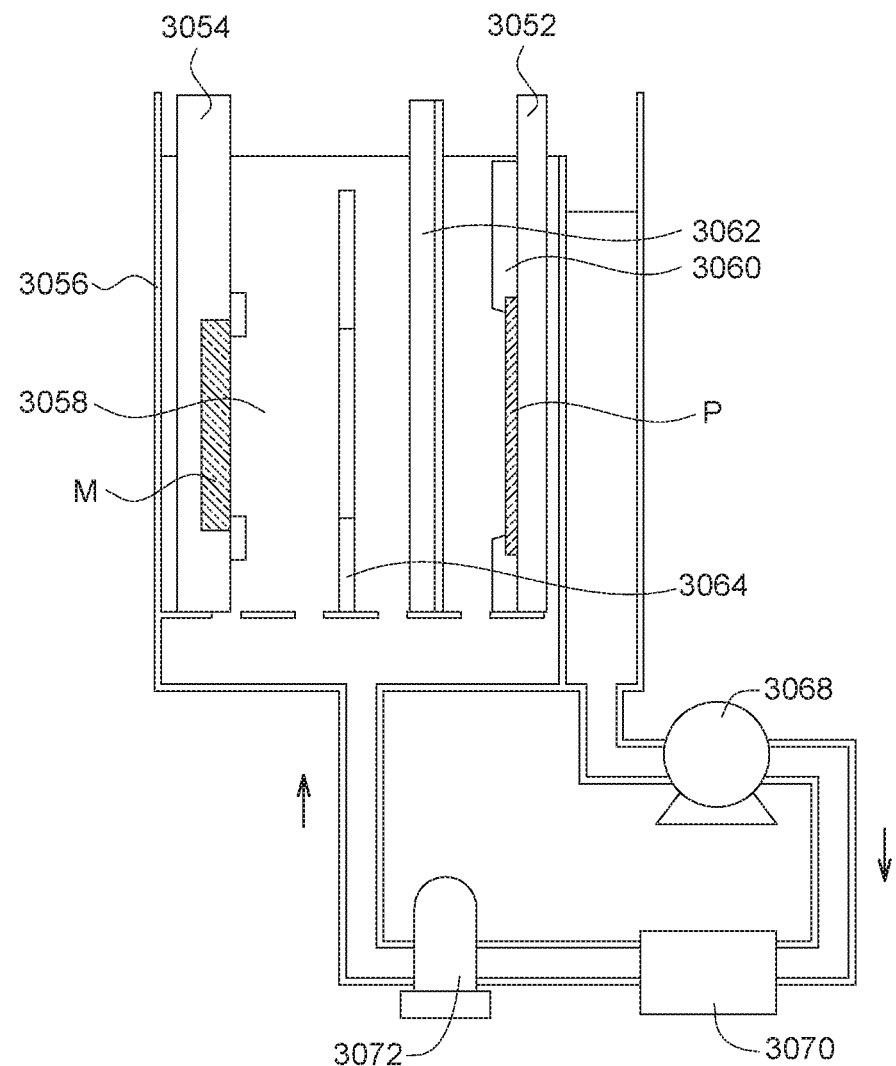
FIG. 26 is a schematic diagram of an electroplating device.

Firstly, the process begins at step 3002, an electroplating device having a cathode and an anode is provided. Refer to FIG. 26, an electroplating device 3050 is shown. The electroplating device 3050 includes a cathode 3052 and an anode 3054. According to some embodiments, the electroplating device 3050 may have an electroplating groove 3056, in which an electroplating solution 3058, a cathode 3052 and an anode 3054 are arranged and immersed. Besides, the electroplating device 3050 may further selectively include at least one of a cathode clamper 3060, a mixer 3062, a deflector 3064, a pump 3068, a temperature controller 3070, and a filter 3072. The cathode clamper 3060 is configured to fix the object to be plated and transmit an outputted power to the object to be plated. The deflector 3064 is arranged between the cathode 3052 and the anode 3054 and configured to guide the flow direction of the electroplating solution. The shape of the deflector 3064 is such as a hollow square disk.

In step 3004, a panel P to be plated is fixed to the cathode 3052 of the electroplating device 3050, particularly to the cathode clamper 3060 of the cathode 3052. The panel P to be plated can be realized by anyone of the panels 100 to 2300 disclosed above. In step 3006, an electroplating material M is fixed at the anode 3054 of the electroplating device 3050. In some embodiments, the electroplating material M can be selected from a group consisting of copper, gold, aluminum, nickel, chrome, and titanium. It can be understood that the order of step 3004 and the order of step 3006 can be exchanged.

Then, in step 3008, an electroplating layer made of the electroplating material is formed on the first patterns 22 to be plated of the units 20 to be plated and the second patterns 132 to 2332 to be plated of the electric field compensation structure 30 of the panel P to be plated by the electroplating device 3050. According to some embodiments, the electroplating layer has a thickness in a range of 2 μm~200 μm. Besides, the electroplating layer may have a wire width less than or equivalent to 15 μm and a spacing less than or equivalent to 15 μm.

It can be understood that other commonly used semiconductor processes can be performed prior to and/or following the electroplating process 3000. For example, it is possible that several processes are already performed to form other elements or other layers on the substrate 10 prior to the electroplating process 3000. In another example, following the electroplating process 3000, other elements or other layers can be formed and be singulated to form the chip.

Figure 27A:
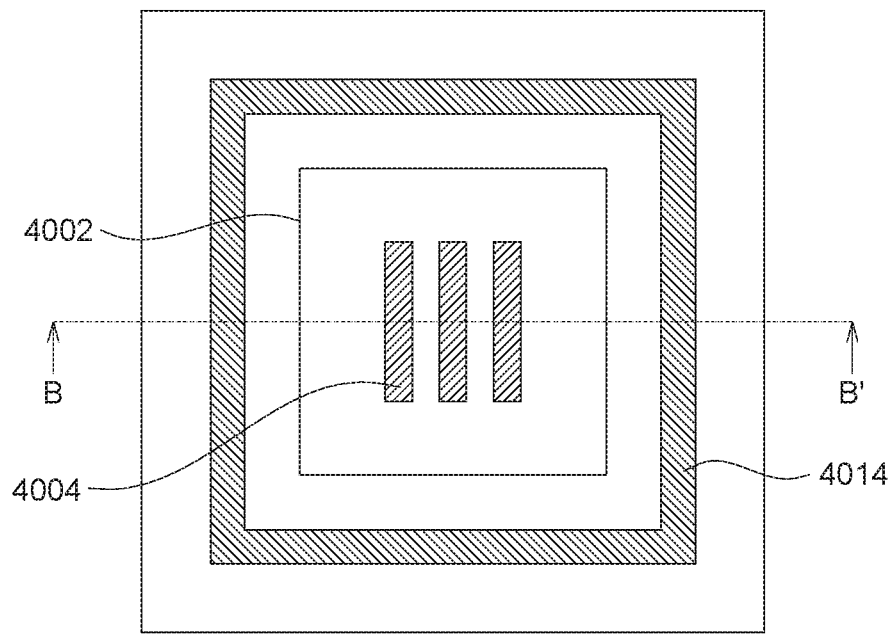
FIG. 27A and FIG. 27B respectively are a top view and a cross-sectional view of a chip.
Figure 27B:
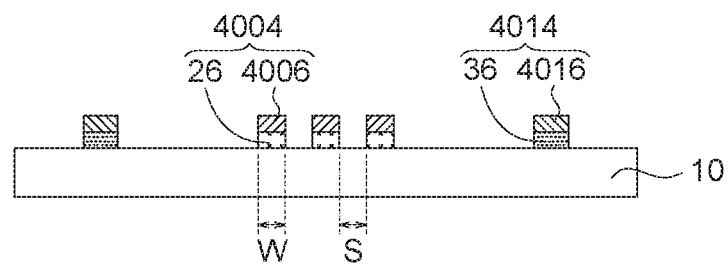

An alternate embodiment of the present invention relates to a chip. Referring to FIG. 27A and FIG. 27B, a top view and a cross-sectional view of a chip 4000 are respectively shown. FIG. 27B is a cross-sectional along the cross-sectional line B-B' of FIG. 27A. For the convenience of description, the chip 4000 formed from the panel 100 is taken for example. The chip 4000 includes a circuit region 4002 and a dummy circuit 4014. The circuit region 4002 includes a circuit 4004. According to some embodiments, the circuit 4004 may have a wire width less than or equivalent to 15 μm and a spacing less than or equivalent to 15 μm. The circuit 4004 includes a first electroplating layer 4006. The dummy circuit 4014 surrounds, and includes a second electroplating layer 4016. The first electroplating layer 4006 and the second electroplating layer 4016 are formed by the same electroplating process, and therefore can be formed of the same material. The first electroplating layer 4006 and the second electroplating layer 4016 have a thickness in a range of 2 μm~200 μm. When a panel is divided to form a chip, basically the panel is divided along the center of the singulation path. Therefore, the dummy circuit 4014 will be partly or completely maintained on the chip 4000, and a ratio of an area of the circuit 4004 to an area of the dummy circuit 4014 will also be in a range from 1:0.07 to 1:0.3.

According to some embodiments, the first patterns 22 to be plated and the second patterns 132 to be plated may respectively include a first seed layer 26 and a second seed layer 36. As indicated in FIG. 27B, the circuit 4004 may include a first seed layer 26 on which the first electroplating layer 4006 is formed. Similarly, the dummy circuit 4014 may include a second seed layer 36 on which the second electroplating layer 4016 is formed. In some embodiments, the first electroplating layer 4006 and the second electroplating layer 4016 can be formed of an element selected from a group consisting of copper, gold, aluminum, nickel, chrome, and titanium; and the first seed layer 26 and the second seed layer 36 includes the element of which the first electroplating layer 4006 and the second electroplating layer 4016 are formed.

General descriptions of various embodiments of the panel to be plated, the electroplating process using the same, and the chip manufactured from the same of the present invention are already disclosed above with reference to accompanying drawings. More specific experimental results of the embodiments will be disclosed below to show how much improvement in the electroplating effect the panel to be plated of the present invention can make.

Comparison Example 1

A 2.5 generation panel, which has patterns to be plated (first patterns to be plated) used for forming circuit but does not include an electric field compensation structure (second patterns to be plated), is used. A total area of the patterns to be plated used for forming circuit is in a range of 15% to 65% of an area of the substrate. Copper is electroplated on the 2.5 generation panel by an electroplating device (an electroplating system manufactured by the Song Jaan Ltd.) similar to the electroplating device of FIG. 26 at a current density of 3 ASD. The electroplated copper layer has a predetermined thickness of 2.4 μm. Then, horizontal measurement and vertical measurement are performed to the left low region, the left central region, the left low region, the central high region, the central region, the central low region, the right high region, the right central region, and the right low region of the panel at an angle of 90° and an angle of 180° respectively by a surface profiler (Kosaka ET-4000). The results of horizontal measurement are listed in Table 1, and the results of vertical measurement are listed in Table 2. In Table 1 and Table 2, the designations LH, LC, LL, CH, CC, CL, RH, RC, RL respectively represent the thickness measured at the 9 regions.

Comparison Example 2

Another 2.5 generation panel, which has patterns to be plated (first patterns to be plated) used for forming circuit but does not include an electric field compensation structure (second patterns to be plated), is used. A total area of the patterns to be plated used for forming circuit is in a range of 15% to 65% of an area of the substrate. Measurement method used in comparison example 2 is the same as that used in comparison example 1, and the measurement results are listed in Table 1 and Table 2.

Comparison Example 3

A 2.5 generation panel, which has patterns to be plated (first patterns to be plated) and includes an electric field compensation structure (second patterns to be plated), is used. The patterns to be plated of the electric field compensation structure are arranged along the 2 longer sides of the substrate instead of surrounding the 4 sides of the panel as indicated in FIG. 24. A total area of the patterns to be plated used for forming circuit is in a range of 15% to 65% of an area of the substrate, and a ratio of an area of the patterns to be plated used for forming circuit to an area of the patterns to be plated of the electric field compensation structure in a range from 1:0.07 to 1:0.3. Measurement method used in comparison example 3 is that same as that used in comparison example 1, and the measurement results are listed in Table 1 and Table 2.

Embodiment 1

A 2.5 generation panel, which has patterns to be plated (first patterns to be plated) and includes an electric field compensation structure (second patterns to be plated), is used. The patterns to be plated of the electric field compensation structure are arranged surrounding the 4 sides of the panel as indicated in FIG. 24. A total area of the patterns to be plated used for forming circuit is in a range of 15% to 65% of an area of the substrate, and a ratio of the patterns to be plated used for forming circuit to an area of the patterns to be plated of the electric field compensation structure in a range from 1:0.07 to 1:0.3. Measurement method used in embodiment 1 is that same as that used in comparison example 1, and the measurement results are listed in Table 1 and Table 2.

[Discussion of the Results]

TABLE 1

Results of Horizontal Measurements

| | Comparison example 1 | Comparison example 2 | Comparison example 3 | Embodiment 1 |
|---|---|---|---|---|
| LH thickness (μm) | 2.38 | 2.1845 | 2.03 | 1.989 |
| LC thickness (μm) | 1.92 | 1.6813 | 1.67 | 1.912 |
| LL thickness (μm) | 4.2 | 3.8421 | 2.36 | 2.025 |
| CH thickness (μm) | 2.25 | 2.0187 | 2.22 | 2.291 |
| CC thickness (μm) | 1.9 | 1.5925 | 1.92 | 2.202 |
| CL thickness (μm) | 3.93 | 3.404 | 2.4 | 2.208 |
| RH thickness (μm) | 2.8 | 2.6344 | 2.74 | 2.072 |
| RC thickness (μm) | 2.44 | 2.3088 | 2.53 | 2.025 |
| RL thickness (μm) | 4.8 | 4.0848 | 2.94 | 2.137 |
| Average thickness (μm) | 2.958 | 2.639 | 2.312 | 2.084 |
| Thickness uniformity (%) | 56.7% | 56.1% | 72.5% | 90.99% |

TABLE 2

Results of Vertical Measurements

| | Comparison example 1 | Comparison example 2 | Comparison example 3 | Embodiment 1 |
|---|---|---|---|---|
| LH thickness (μm) | 6.25 | 5.547 | 4.94 | 2.0542 |
| LC thickness (μm) | 2.43 | 2.1253 | 1.81 | 1.9891 |
| LL thickness (μm) | 2.94 | 2.4509 | 2.11 | 2.0602 |
| CH thickness (μm) | 5.00 | 4.4163 | 4.9 | 2.7291 |
| CC thickness (μm) | 1.99 | 1.5866 | 1.97 | 2.6207 |
| CL thickness (μm) | 2.14 | 1.628 | 2.03 | 2.8594 |
| RH thickness (μm) | 5.39 | 4.8011 | 5.1 | 2.0306 |
| RC thickness (μm) | 2.06 | 1.7938 | 2.03 | 1.9358 |

TABLE 2-continued

| | Results of Vertical Measurements | | | |
|---|---|---|---|---|
| | Comparison example 1 | Comparison example 2 | Comparison example 3 | Embodiment 1 |
| RL thickness (μm) | 2.24 | 1.7109 | 2.02 | 2.001 |
| Average thickness (μm) | 3.382 | 2.896 | 2.99 | 2.08 |
| Thickness uniformity (%) | 48.3% | 44.5% | 52.4% | 92.76% |

As indicated in Table 1 and Table 2, without the arrangement of the electric field compensation structure, part of the electroplated copper layer, formed on the 2.5 generation panel and having a predetermined thickness of 2.4 μm, may have a thickness over 3.4 μm or may even be over 6 μm. In comparison, with the arrangement of the electric field compensation structure helps, thickness uniformity can be enhanced. With the arrangement of a peripheral compensation structure, thickness uniformity may even be increased to 90% or above.

Besides, the influences under different circuit architectures with the arrangement of the electric field compensation structure are compared to that without the arrangement of the electric field compensation structure. In comparison example 4 and comparison example 5, the 2.5 generation panel, which has patterns to be plated (first patterns to be plated) of different circuit architectures but does not include an electric field compensation structure, is used. In embodiments 2 to 4, the 2.5 generation panel, which has patterns to be plated (first patterns to be plated) of different circuit architectures and includes an electric field compensation structure (second patterns to be plated), is used. The patterns to be plated of the electric field compensation structure surround the 4 sides of the panel as indicated in FIG. 23. In comparison example 4, comparison example 5, and embodiments 2 to 4, a total area of the patterns to be plated used for forming circuit is in a range of 15% to 65% of an area of the substrate. In embodiments 2 to 4, a ratio of an area of the patterns to be plated used for forming circuit to an area of the patterns to be plated of the electric field compensation structure in a range from 1:0.07 to 1:0.3. The electroplated copper layer has a predetermined thickness of 3.3 μm. In other comparison example or embodiments, copper is electroplated in the same way as in comparison example 1, horizontal measurement is performed, and the experimental results are listed in Table 3.

As indicated in Table 3, the electroplated copper layer having a predetermined thickness of 3.3 μm is formed on the 2.5 generation panel, and thickness is measured at the 9 regions LH, LC, LL, CH, CC, CL, RH, RC, and RL of the panel. The results of measurement show that without the arrangement of the electric field compensation structure, in comparison example 4 and comparison example 5 where the panel has different circuit architectures, the electroplated copper layer has an average thickness over 4.6 μm, and the thickness measured at the left low region (LH) and the left low region (LL) of the panel may even be over 7 μm. In comparison, the experimental results of embodiments 2 to 4 show that under different circuit architectures, with the arrangement of the electric field compensation structure, the average thickness of the electroplated copper layer can meet the expectation of the predetermined thickness, and the film thickness uniformity of the panel can be effectively increased to 94% or above.

To summarize, when the panel having an electric field compensation structure according to an embodiment of the present invention is electroplated, the current outputted to the entire substrate can be stabilized, the output distribution of electric field over a substrate having a large area can be enhanced and stabilized, and the problem of having a non-uniform distribution of electric field over the substrate having a large area during the electroplating process can therefore be resolved. Thus, the thickness uniformity of the electroplating layer (having different wire dimensions and contacts) can be improved, and the formation of defects, such as indents in the internal structure of the electroplating layer, can be reduced. Here, the large-sized panel and substrate refer to the 2.5 or higher generation panel and the substrate using the same. In some embodiments, the 2.5 generation panel (370 mm×470 mm) to the fifth generation panel (1100 mm×1300 mm) can be used. However, the present invention can be used in a higher generation panel. Although the substrate and the panel are exemplified by rectangular substrate and panel, it can be understood that the electric field compensation structure of the present invention can be used in the substrate having other shape, such as wafer.

It will be apparent to those skilled in the art that various modifications and variations can be made to the disclosed embodiments. It is intended that the specification and examples be considered as exemplary only, with a true scope of the disclosure being indicated by the following claims and their equivalents.

TABLE 3

| | Results of Horizontal Measurement | | | | |
|---|---|---|---|---|---|
| | Comparison example 4 | Comparison example 5 | Embodiment 2 | Embodiment 3 | Embodiment 4 |
| LH thickness (μm) | 7.329 | 7.0566 | 3.3922 | 3.2856 | 3.4869 |
| LC thickness (μm) | 5.7306 | 5.7069 | 3.185 | 3.2382 | 3.5875 |
| LL thickness (μm) | 7.1691 | 7.1336 | 3.5165 | 3.552 | 3.6171 |
| CH thickness (μm) | 3.9605 | 3.9309 | 3.2678 | 3.3744 | 3.5461 |
| CC thickness (μm) | 2.7469 | 4.0789 | 3.3448 | 3.3685 | 3.4277 |
| CL thickness (μm) | 3.6763 | 3.6586 | 3.3803 | 3.4573 | 3.2323 |
| RH thickness (μm) | 4.4933 | 4.4578 | 3.2797 | 3.3685 | 3.5106 |
| RC thickness (μm) | 3.1554 | 3.1139 | 3.1376 | 3.2086 | 3.2264 |
| RL thickness (μm) | 3.9723 | 4.0078 | 3.2442 | 3.2915 | 3.3566 |
| Average thickness (μm) | 4.69 | 4.79 | 3.31 | 3.35 | 3.44 |
| Thickness uniformity (%) | 54.52 | 60.77 | 94.31 | 94.92 | 94.7 |

What is claimed is:

1. A panel to be plated, comprising:
   a substrate comprising a plurality of units to be plated, wherein each of the units to be plated comprises a first pattern to be plated; and
   an electric field compensation structure disposed on the substrate, wherein the electric field compensation structure comprises a second pattern to be plated surrounding at least one of the units to be plated;
   wherein a ratio of an area of the first pattern to be plated of the units to be plated to an area of the second pattern to be plated of the electric field compensation structure is in a range from 1:0.07 to 1:0.3.

2. The panel to be plated according to claim 1, wherein the second pattern to be plated comprises a plurality of unit frame patterns respectively surrounding one of the units to be plated.

3. The panel to be plated according to claim 2, wherein wire widths of the unit frame patterns diminish in a direction from an edge towards a center of the substrate.

4. The panel to be plated according to claim 2, wherein a quantity of the unit frame patterns is the same as a quantity of the units to be plated.

5. The panel to be plated according to claim 2, wherein the second pattern to be plated comprises at least one peripheral frame pattern respectively surrounding several of the units to be plated and several of the unit frame patterns.

6. The panel to be plated according to claim 5, wherein a quantity of the at least one peripheral frame pattern is plural, and wire widths of the peripheral frame patterns diminish in a direction from an edge towards a center of the substrate.

7. The panel to be plated according to claim 1, wherein the second pattern to be plated comprises at least one peripheral frame pattern respectively surrounding several of the units to be plated.

8. The panel to be plated according to claim 7, wherein a quantity of the at least one peripheral frame pattern is plural, and wire widths of the peripheral frame patterns diminish in a direction from an edge towards a center of the substrate.

9. The panel to be plated according to claim 7, wherein a wire width of the at least one peripheral frame pattern along the longer side direction of the substrate is larger than a wire width of the at least one peripheral frame pattern along the shorter side direction of the substrate.

10. The panel to be plated according to claim 7, wherein the at least one peripheral frame pattern comprises a trunk portion and a plurality of comb portions extended towards a center of the substrate from the trunk portion.

11. The panel to be plated according to claim 10, wherein the at least one peripheral frame pattern further comprises a plurality of connecting portions connecting the comb portions.

12. The panel to be plated according to claim 10, wherein a wire width of the at least one peripheral frame pattern along the longer side direction of the substrate is larger than a wire width of the at least one peripheral frame pattern along the shorter side direction of the substrate.

13. The panel to be plated according to claim 1, wherein the second pattern to be plated comprises a peripheral frame pattern arranged along an edge of the substrate and surrounding all of the units to be plated.

14. The panel to be plated according to claim 13, wherein a wire width of the peripheral frame pattern along the longer side direction of the substrate is larger than a wire width of the peripheral frame pattern along the shorter side direction of the substrate.

15. The panel to be plated according to claim 1, wherein a total area of the first pattern to be plated of the units to be plated is in a range of 15% to 65% of an area of the substrate.

16. The panel to be plated according to claim 1, wherein the first pattern to be plated comprises a first seed layer, the second pattern to be plated comprises a second seed layer, and the first seed layer and the second seed layer comprise at least one element selected from a group consisting of copper, gold, aluminum, nickel, chrome, and titanium.

17. An electroplating process, comprising:
    providing an electroplating device having a cathode and an anode;
    fixing the panel to be plated according to claim 1 to the cathode of the electroplating device;
    fixing an electroplating material to the anode of the electroplating device; and
    forming an electroplating layer made of the electroplating material on the first pattern to be plated of the units to be plated of the panel to be plated and the second pattern to be plated of the electric field compensation structure by the electroplating device.

18. The electroplating process according to claim 17, wherein the second pattern to be plated comprises a plurality of unit frame patterns respectively surrounding one of the units to be plated.

19. A chip, comprising:
    a circuit region comprising a circuit, wherein the circuit comprises a first electroplating layer; and
    a dummy circuit surrounding the circuit region, wherein the dummy circuit comprises a second electroplating layer,
    wherein the first electroplating layer and the second electroplating layer are formed of the same material;
    wherein a ratio of an area of the circuit to an area of the dummy circuit is in a range from 1:0.07 to 1:0.3.

20. The chip according to claim 19, wherein the circuit comprises a first seed layer on which the first electroplating layer is formed, the dummy circuit comprises a second seed layer on which the second electroplating layer is formed, the first electroplating layer and the second electroplating layer are formed of an element selected from a group consisting of copper, gold, aluminum, nickel, chrome, and titanium, and the first seed layer and the second seed layer comprise the element of which the first electroplating layer and the second electroplating layer are formed.

* * * * *